United States Patent
Son

(10) Patent No.: US 9,123,550 B2
(45) Date of Patent: Sep. 1, 2015

(54) SEMICONDUCTOR DEVICES USING AIR SPACES TO SEPARATE CONDUCTIVE STRUCTURES AND METHODS OF MANUFACTURING THE SAME

(71) Applicant: Nak-jin Son, Suwon-si (KR)

(72) Inventor: Nak-jin Son, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/020,252

(22) Filed: Sep. 6, 2013

(65) Prior Publication Data

US 2014/0077333 A1 Mar. 20, 2014

(30) Foreign Application Priority Data

Sep. 14, 2012 (KR) ........................ 10-2012-0102269

(51) Int. Cl.
  H01L 21/70 (2006.01)
  H01L 29/06 (2006.01)
  H01L 21/764 (2006.01)
  H01L 27/108 (2006.01)
  H01L 21/768 (2006.01)

(52) U.S. Cl.
  CPC .......... H01L 29/0649 (2013.01); H01L 21/764 (2013.01); H01L 21/7682 (2013.01); H01L 27/10855 (2013.01); H01L 27/10885 (2013.01)

(58) Field of Classification Search
  CPC .............. H01L 29/0649; H01L 21/764; H01L 27/10855
  USPC .................... 257/522; 438/421, 411, 619
  See application file for complete search history.

(56) References Cited

U.S. PATENT DOCUMENTS

| | | | |
|---|---|---|---|
| 6,551,877 B1 * | 4/2003 | Wu | 438/256 |
| 7,589,369 B2 | 9/2009 | Haller | |
| 2002/0076880 A1 * | 6/2002 | Yamada et al. | 438/243 |
| 2004/0097065 A1 * | 5/2004 | Lur et al. | 438/619 |
| 2010/0327346 A1 | 12/2010 | Jeong et al. | |
| 2011/0147889 A1 | 6/2011 | Tsuchiya | |
| 2011/0241102 A1 | 10/2011 | Cho et al. | |
| 2012/0058639 A1 | 3/2012 | Sim et al. | |
| 2012/0126306 A1 * | 5/2012 | Kawaguchi et al. | 257/319 |

FOREIGN PATENT DOCUMENTS

| | | |
|---|---|---|
| JP | 2012-019035 | 1/2012 |
| KR | 2008-0000831 A | 1/2008 |
| KR | 2011-0029672 A | 3/2011 |
| KR | 2011-0023001 A | 8/2011 |
| KR | 2011-0101678 A | 9/2011 |

* cited by examiner

Primary Examiner — Tu-Tu Ho
(74) Attorney, Agent, or Firm — Myers Bigel Sibley & Sajovec, P.A.

(57) ABSTRACT

A semiconductor device includes a substrate, a conductive pattern (e.g., a contact plug) on an active region of the substrate and having respective first and second sidewalls on opposite first and second sides of the conductive pattern, and first and second conductive lines (e.g., bit lines) on the substrate on respective ones of the first and second sides of conductive pattern and separated from the respective first and second sidewalls by asymmetric first and second air spaces.

19 Claims, 42 Drawing Sheets

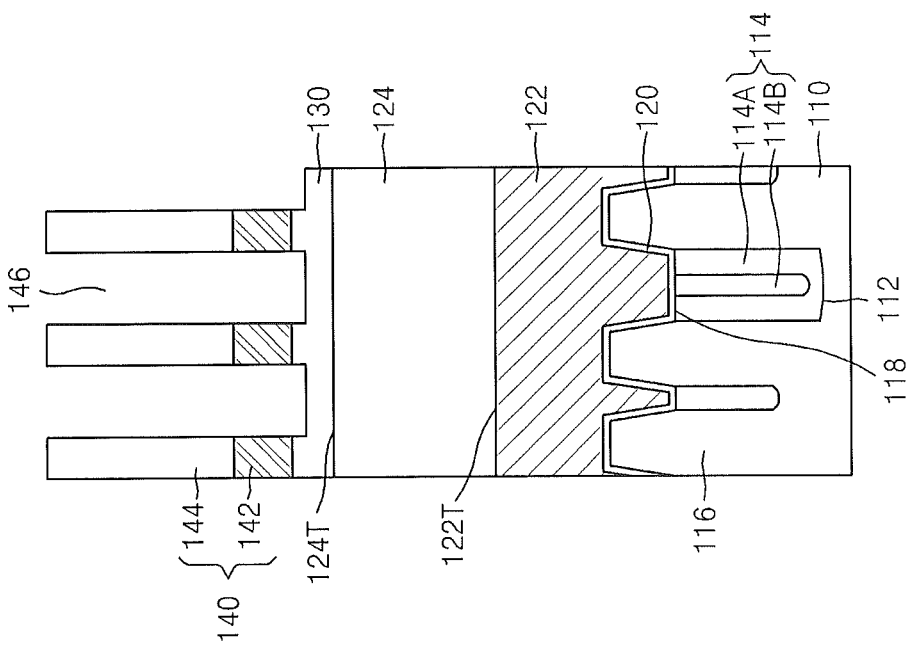
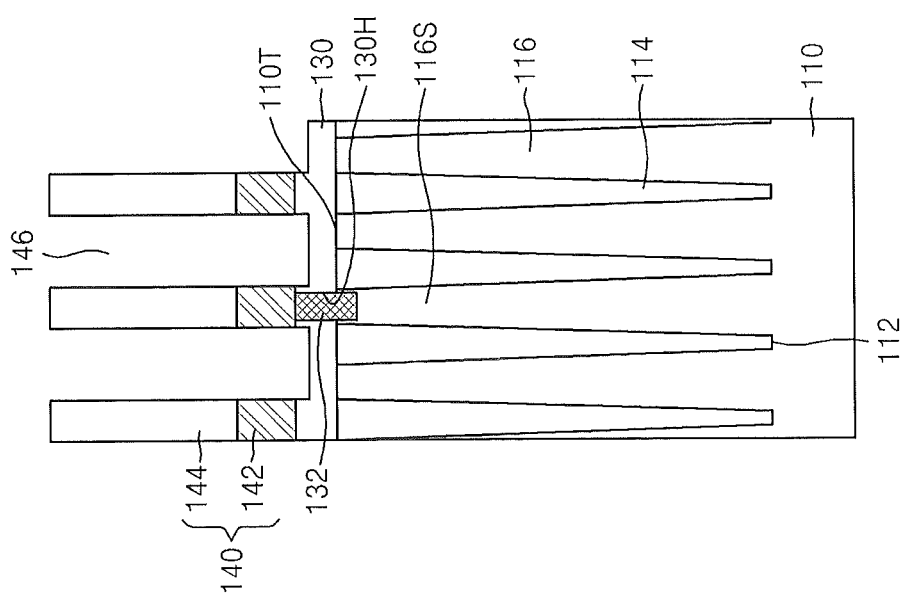

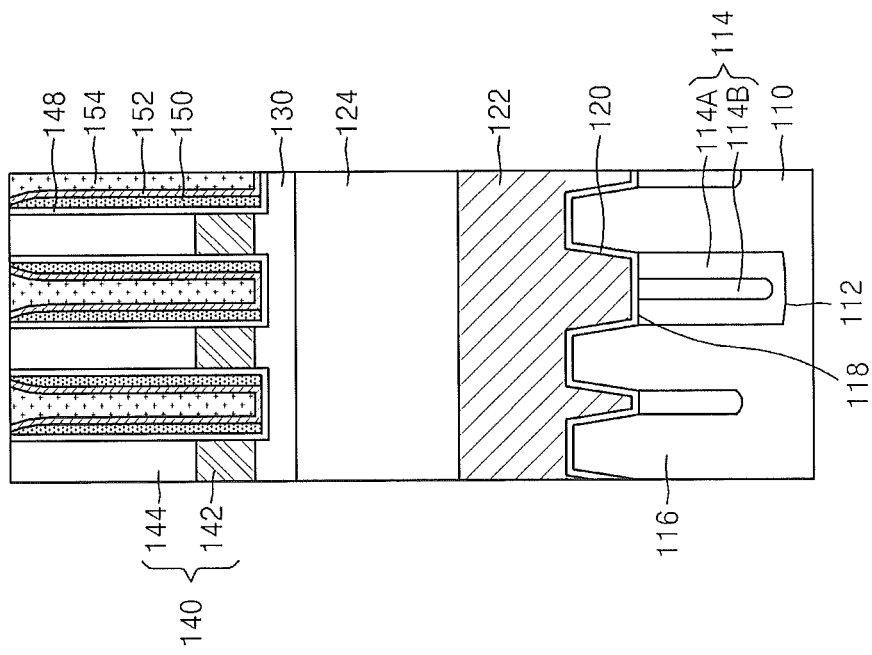
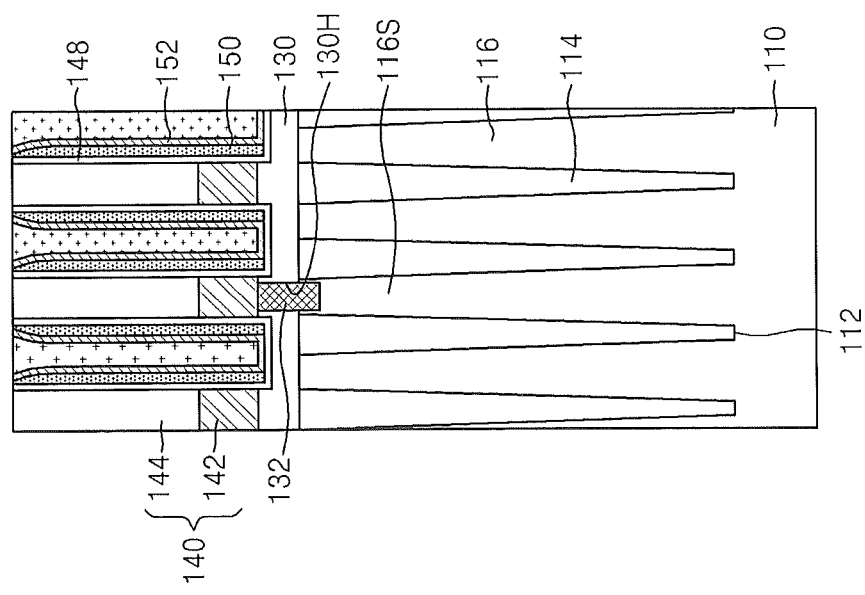

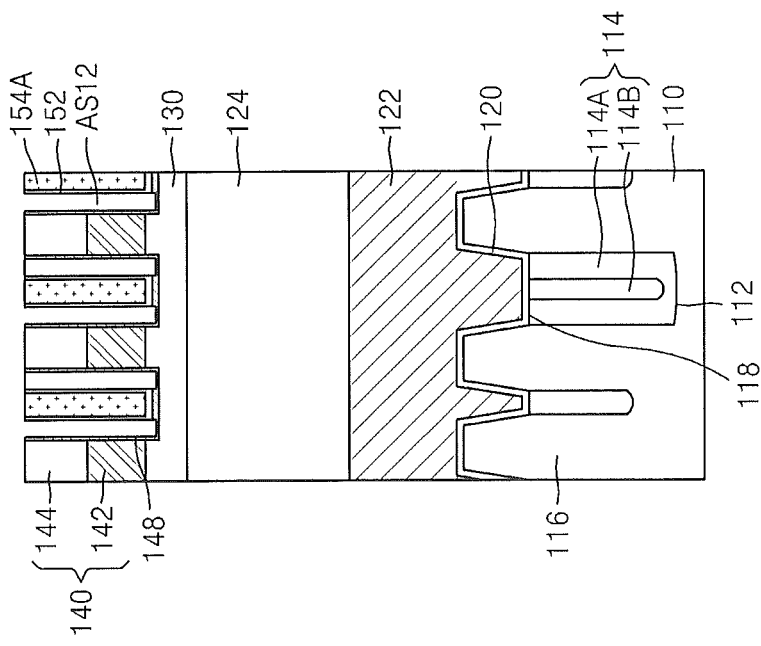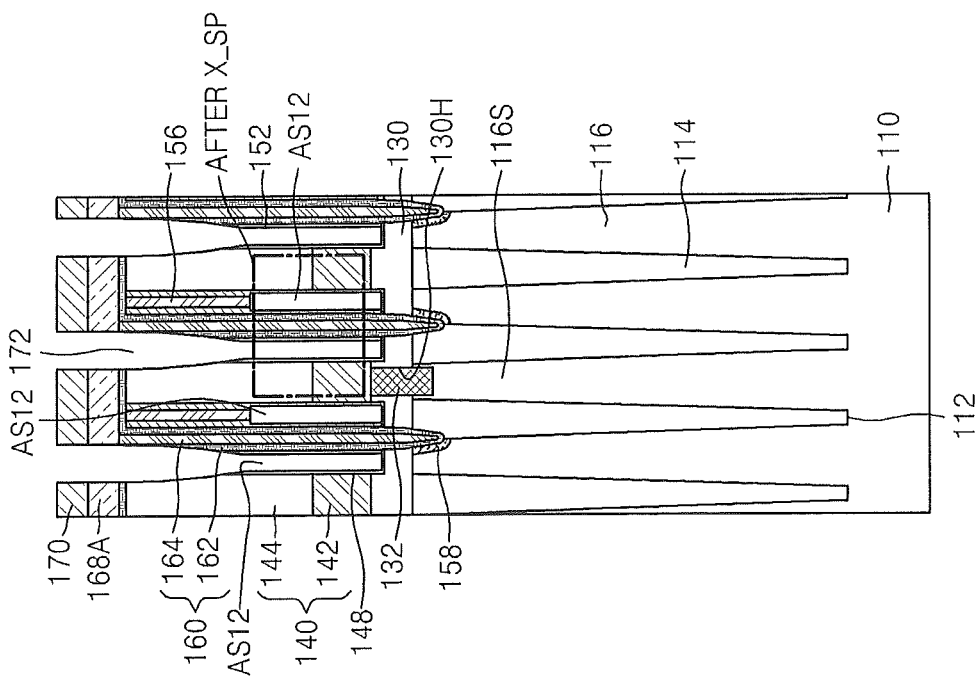

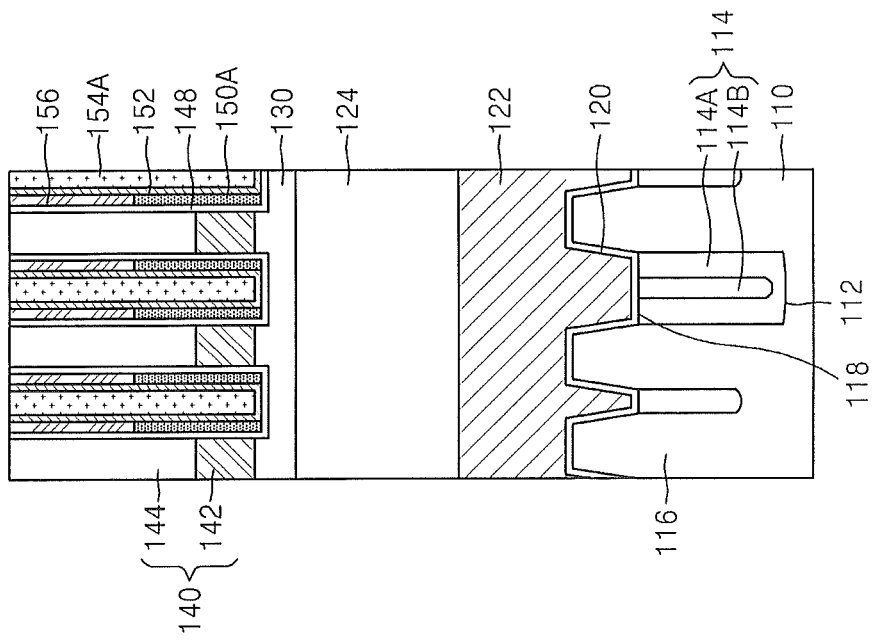
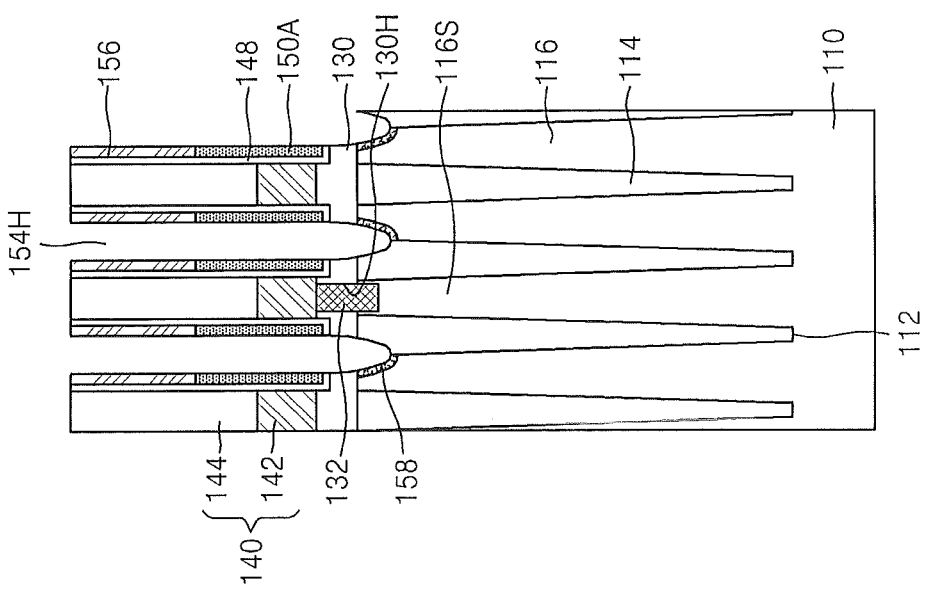
FIG. 15A
FIG. 15B

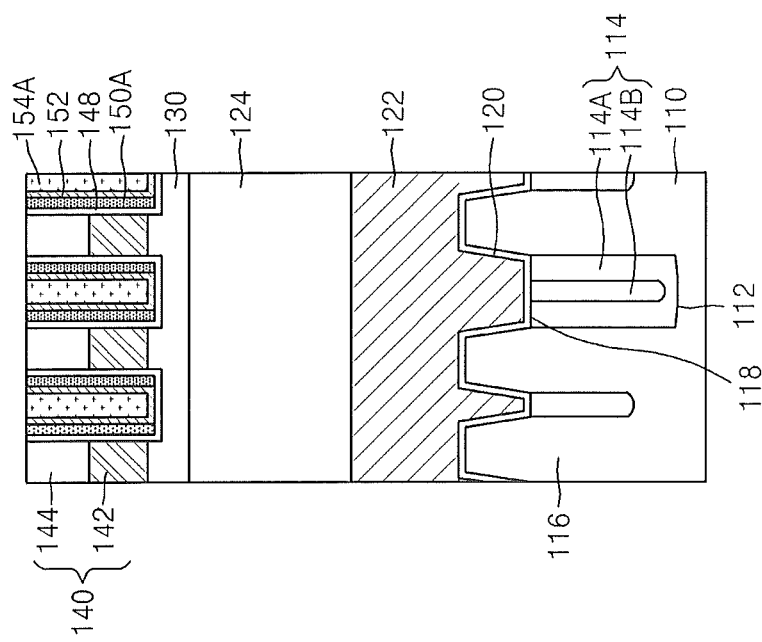
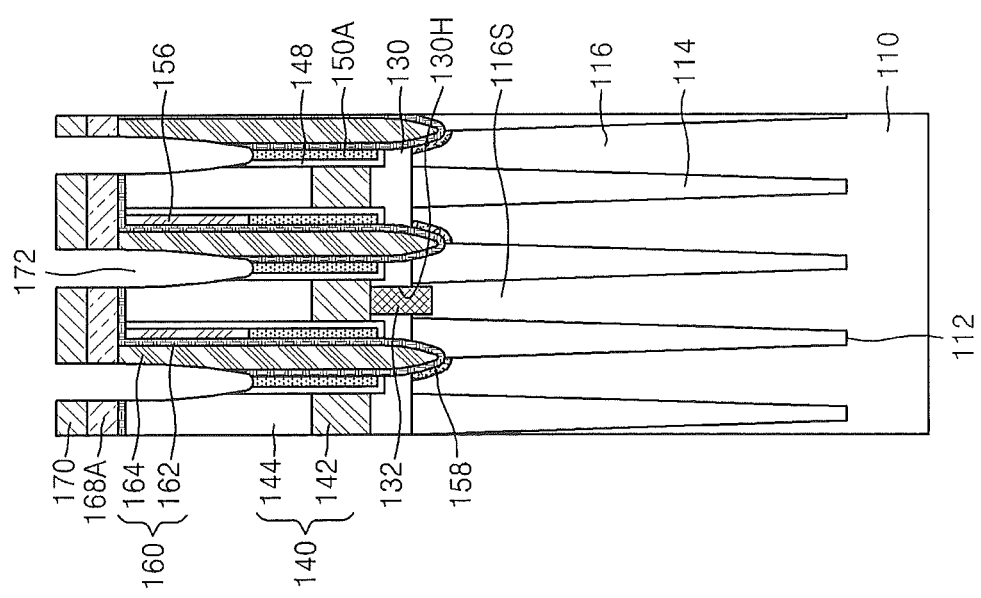

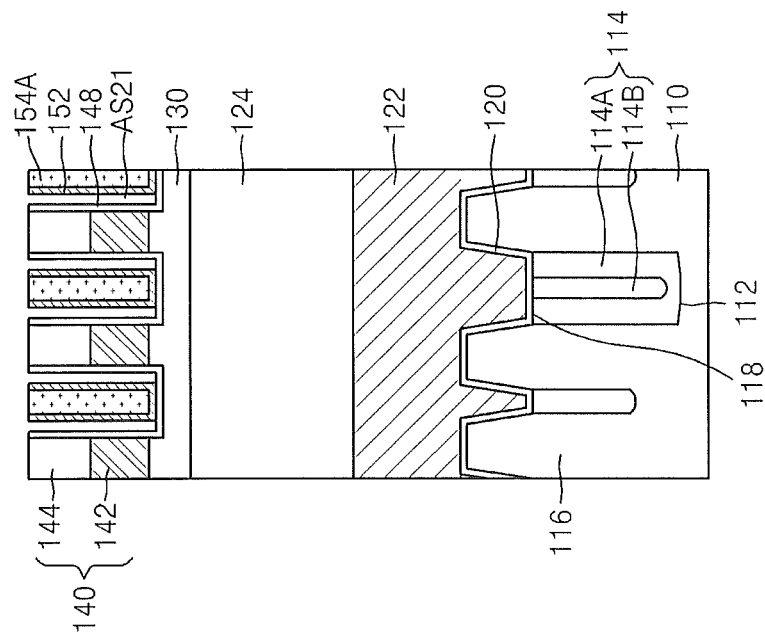
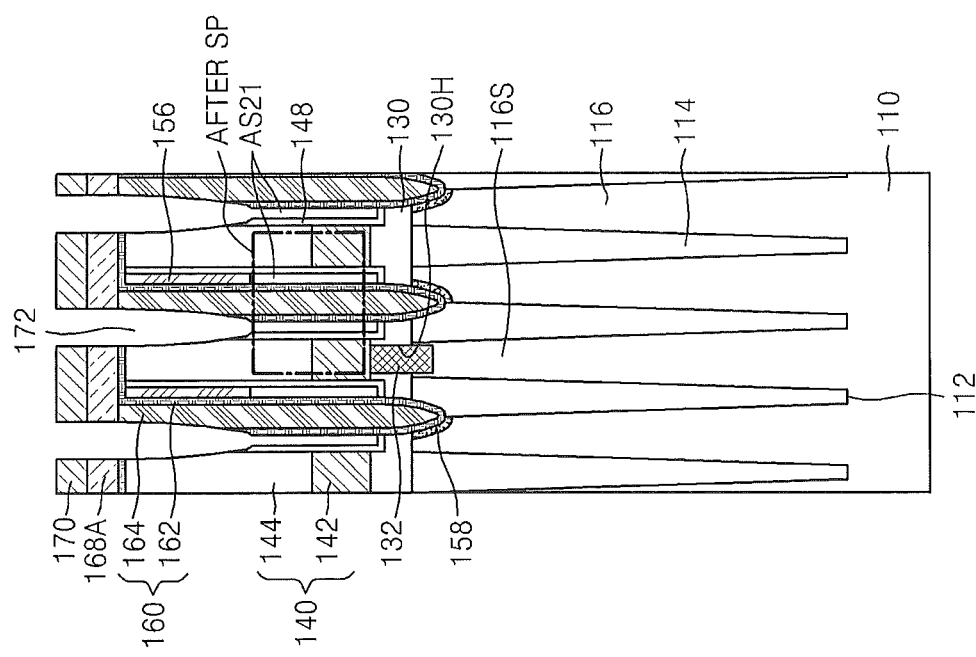

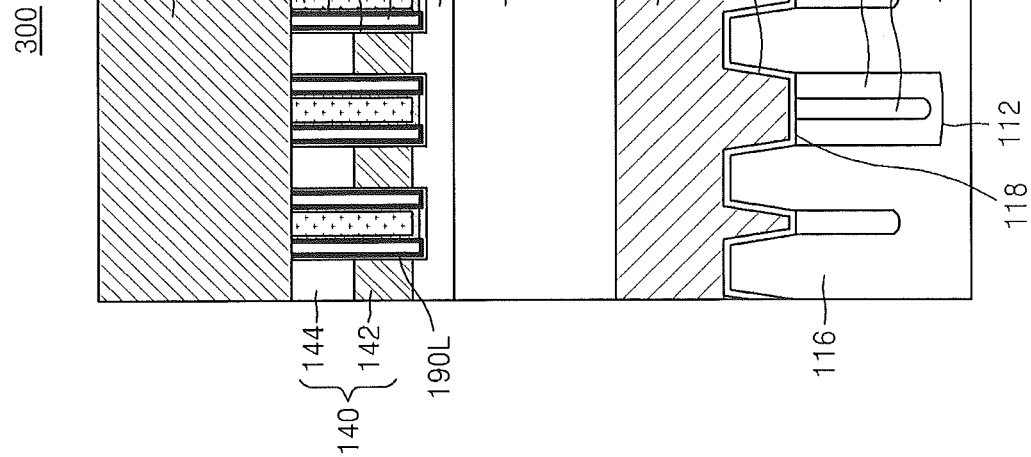
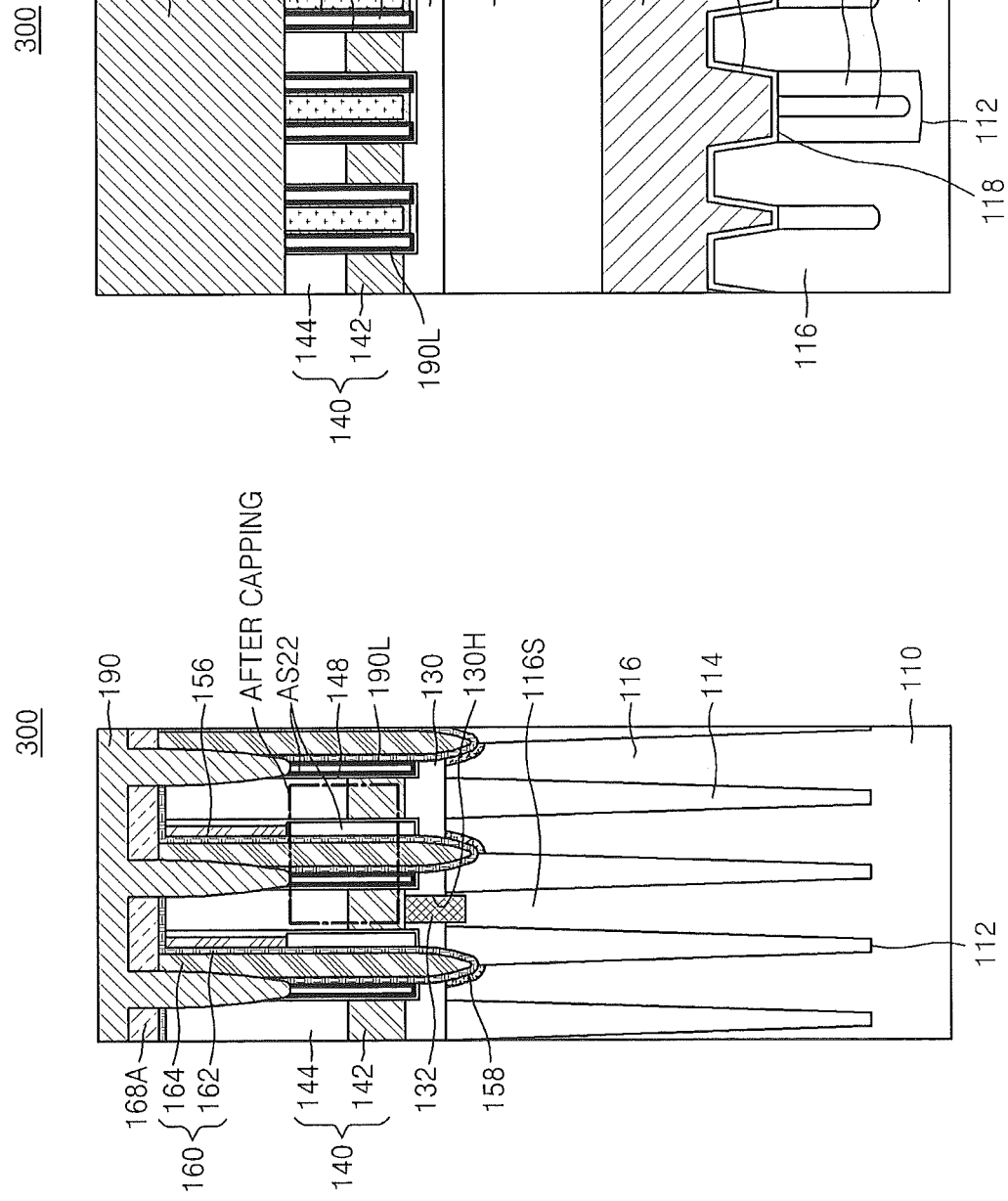

SEMICONDUCTOR DEVICES USING AIR SPACES TO SEPARATE CONDUCTIVE STRUCTURES AND METHODS OF MANUFACTURING THE SAME

CROSS-REFERENCE TO RELATED APPLICATIONS

This application claims the benefit of Korean Patent Application No. 10-2012-0102269, filed on Sep. 14, 2012, in the Korean Intellectual Property Office, the disclosure of which is incorporated herein in its entirety by reference.

BACKGROUND

The inventive concept relates to semiconductor devices and methods of manufacturing the same, and more particularly, to semiconductor devices having conductive structures disposed closely adjacent one another and methods of manufacturing the same.

With an increase in the integration density of semiconductor devices, the design rules of semiconductor devices have been reduced. In a highly scaled semiconductor device, a distance between a plurality of interconnection lines and a plurality of contact plugs interposed therebetween has gradually been reduced. Thus, a load capacitance between adjacent conductive patterns may increase and thereby deteriorate operating speed or refresh characteristics. Accordingly, semiconductor devices capable of solving the above-described problems are desired.

SUMMARY

Some embodiments of the inventive subject matter provide a semiconductor device including a substrate, a conductive pattern (e.g., a contact plug) on an active region of the substrate and having respective first and second sidewalls on opposite first and second sides of the conductive pattern and first and second conductive lines (e.g., bit lines) on the substrate on respective ones of the first and second sides of conductive pattern and separated from the respective first and second sidewalls by asymmetric first and second air spaces.

In some embodiments, the first and second air spaces may have different widths. In some embodiments, at least one of the first and second air spaces may have a non-uniform width. In further embodiments, the first air space may have a uniform width and the second air space may have a non-uniform width.

The device may further include a first insulating layer covering a sidewall of the first conductive line between the first air space and the first conductive line, a second insulating layer covering the first sidewall of the conductive pattern, and a third insulating layer covering a sidewall of the second conductive line between the second air space and the second conductive line. The second sidewall of the conductive pattern and the third insulating layer may be exposed in the second air space. The device may also include a fourth insulating layer covering the second sidewall of the conductive pattern. The first and second insulating layers may have different thicknesses. The thickness of the first insulating layer may be greater than the thickness of the second insulating layer.

In some embodiments, the conductive pattern may be one of a plurality of contact plugs arranged in a row along a first direction between the first and second conductive lines and the device may further include a plurality of insulating patterns, respective ones of which filling spaces between adjacent ones of the contact plugs. The plurality of contact plugs and the plurality of insulating patterns may have different widths in a second direction perpendicular to the first direction. The first and second air spaces may extend along the first direction to separate the plurality of contact plugs from the first and second conductive lines. The first air space may have a first width between the first conductive line and the plurality of contact plugs and a second width greater than the first width between the first conductive line and the plurality of insulating patterns. The second air space may have a first width between the second conductive line and the plurality of contact plugs and a second width greater than the first width between the second conductive line and the plurality of insulating patterns. In some embodiments, the plurality of contact plugs and the plurality of insulating patterns may have the same width.

Further embodiments of the inventive subject matter provide a semiconductor device including a substrate, first and second conductive lines disposed on the substrate and extending along a first direction and a plurality of contact plugs disposed between the first and second conductive lines and separated therefrom by asymmetrical first and second air spaces. At least one of the first and second air spaces may have an irregular width along a lengthwise direction thereof.

Method embodiments of the inventive subject matter include forming a pair of conductive lines on a substrate and extending along a first direction, forming an insulating liner on opposing sidewalls of the pair of conductive lines, forming respective sacrificial spacers on the insulating liner on the sidewalls of the pair of conductive lines, forming a row of contact plugs and insulating patterns between the pair of conductive lines, the insulating patterns separating adjacent ones of the contact plugs, and removing the sacrificial spacers to form asymmetric first and second air spaces separating respective ones of the pair of conductive lines from the plurality of contact plugs. Removing the sacrificial spacers to form asymmetric first and second air spaces separating respective ones of the pair of conductive lines from the plurality of contact plugs may include removing portions of the sacrificial spacers before forming the contact plugs and removing remaining portions of the sacrificial spacers after forming the contact plugs.

Still further method embodiments include forming first and second spaced-apart conductive lines on a substrate, forming an insulating liner on sidewalls of the plurality of conductive lines, forming a first sacrificial layer on the insulating liner, forming a second sacrificial layer on the first sacrificial layer, forming a insulating region on the second sacrificial layer between the first and second conductive lines, removing portions of insulating region to form a plurality of contact holes, removing portions of the second sacrificial layer exposed by the plurality of contact holes, forming a plurality of contact plugs in the plurality of contact holes, and removing the first sacrificial layer to form asymmetric first and second air spaces separating respective ones of the first and second conductive lines from the plurality of contact plugs.

BRIEF DESCRIPTION OF THE DRAWINGS

Exemplary embodiments of the inventive concept will be more clearly understood from the following detailed description taken in conjunction with the accompanying drawings in which:

FIGS. 3A, 3B, 4A, 4B, 5A, 5B, 6A, 6B, 7A, 7B, 8A, 8B, 9A, 9B, 10A, 10B, 11A, 11B, 12A, 12B, 12C, 12D, 13A, 13B, 13C, 13D, 14A, 14B, 14C, and 14D are cross-sectional views illustrating operations for manufacturing a semiconductor device according to exemplary embodiments of the inventive concept;

FIGS. 15A, 15B, 16A, 16B, 17A, 17B, 18A, 18B, 18C, 18D, 19A, 19B, 19C, 19D, 20A, 20B, 20C, and 20D are cross-sectional views illustrating operations for manufacturing a semiconductor device according to exemplary embodiments of the inventive concept;

DETAILED DESCRIPTION

Figure 1:
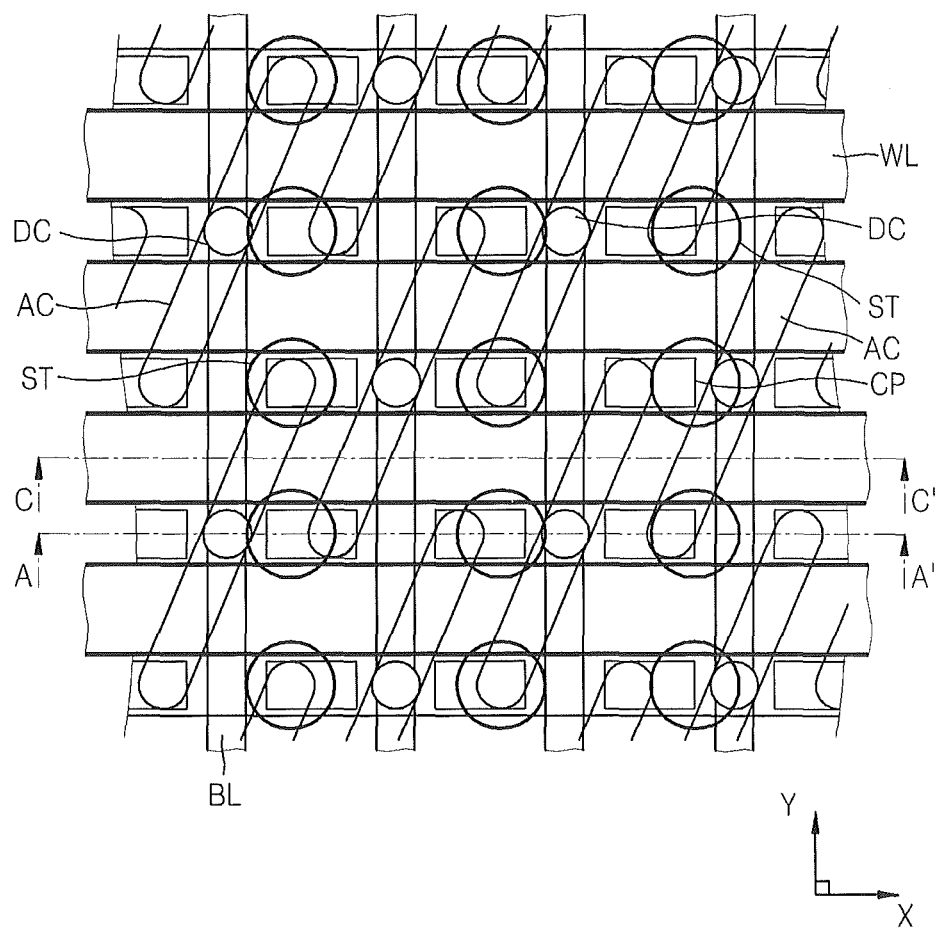
FIG. 1 is a schematic layout of a semiconductor device according to exemplary embodiments of the inventive concept.

The inventive concept will now be described more fully hereinafter with reference to the accompanying drawings, in which exemplary embodiments of the inventive concept are shown. The same reference numerals are used to denote the same items of the drawings, and a repeated description thereof is omitted.

This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

It will be understood that, although the terms first, second, etc. may be used herein to describe various items, components, regions, layers and/or sections, these items, components, regions, layers and/or sections should not be limited by these terms. These terms are only used to distinguish one item, component, region, layer or section from another region, layer or section. Thus, a first item, component, region, layer or section discussed below could be termed a second item, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the inventive concept may be performed otherwise. That is, the respective steps may be performed in a specified order, substantially at the same time, or in reverse order.

As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing.

FIG. 1 is a schematic layout of a semiconductor device 100 according to exemplary embodiments of the inventive concept. A layout shown in FIG. 3A may be applied to, for example, a semiconductor memory device including a memory cell with a unit cell size of $6F^2$. Here, F refers to the minimum lithographic feature size.

Referring to FIG. 1, the semiconductor device 100 may include a plurality of active regions AC. A plurality of word lines WL may run across the plurality of active regions AC and extend parallel to one another in a first direction (refer to an X direction of FIG. 1). The word lines WL may be disposed at regular intervals. A plurality of bit lines BL may be disposed on the plurality of word lines WL and extend parallel to one another in a second direction (refer to a Y direction of FIG. 1) orthogonal to the first direction.

The plurality of bit lines BL may be connected to the plurality of active regions AC through a plurality of direct contacts (DCs).

In some embodiments, the plurality of bit lines BL may be disposed parallel to one another at a pitch of 3F. The plurality of word lines WL may be disposed parallel to one another at a pitch of 2F.

A plurality of contact plugs CP may be arranged in a row in the first and second directions between adjacent ones of the plurality of bit lines BL. In some embodiments, the plurality of contact plugs CP may be disposed at regular intervals in the second direction. The plurality of contact plugs CP may constitute buried contacts BC configured to electrically connect storage electrodes ST of capacitors to the active regions AC.

Figure 2A:
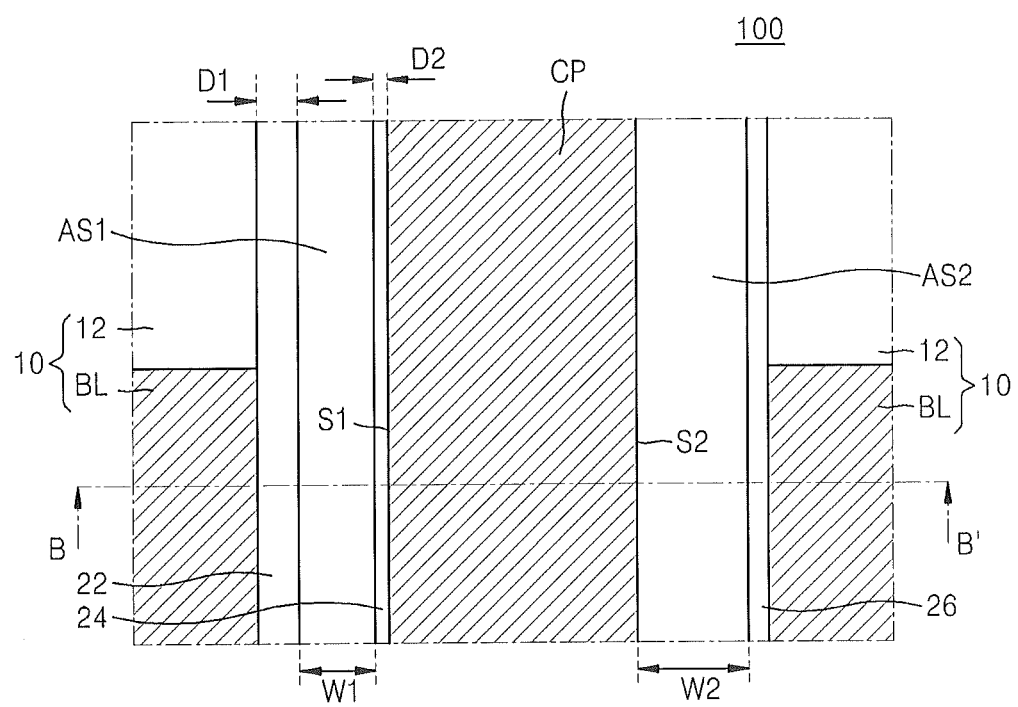
FIG. 2A is a cross-sectional view of the semiconductor device of FIG. 1 taken along a line A-A' of FIG. 1.
Figure 2B:
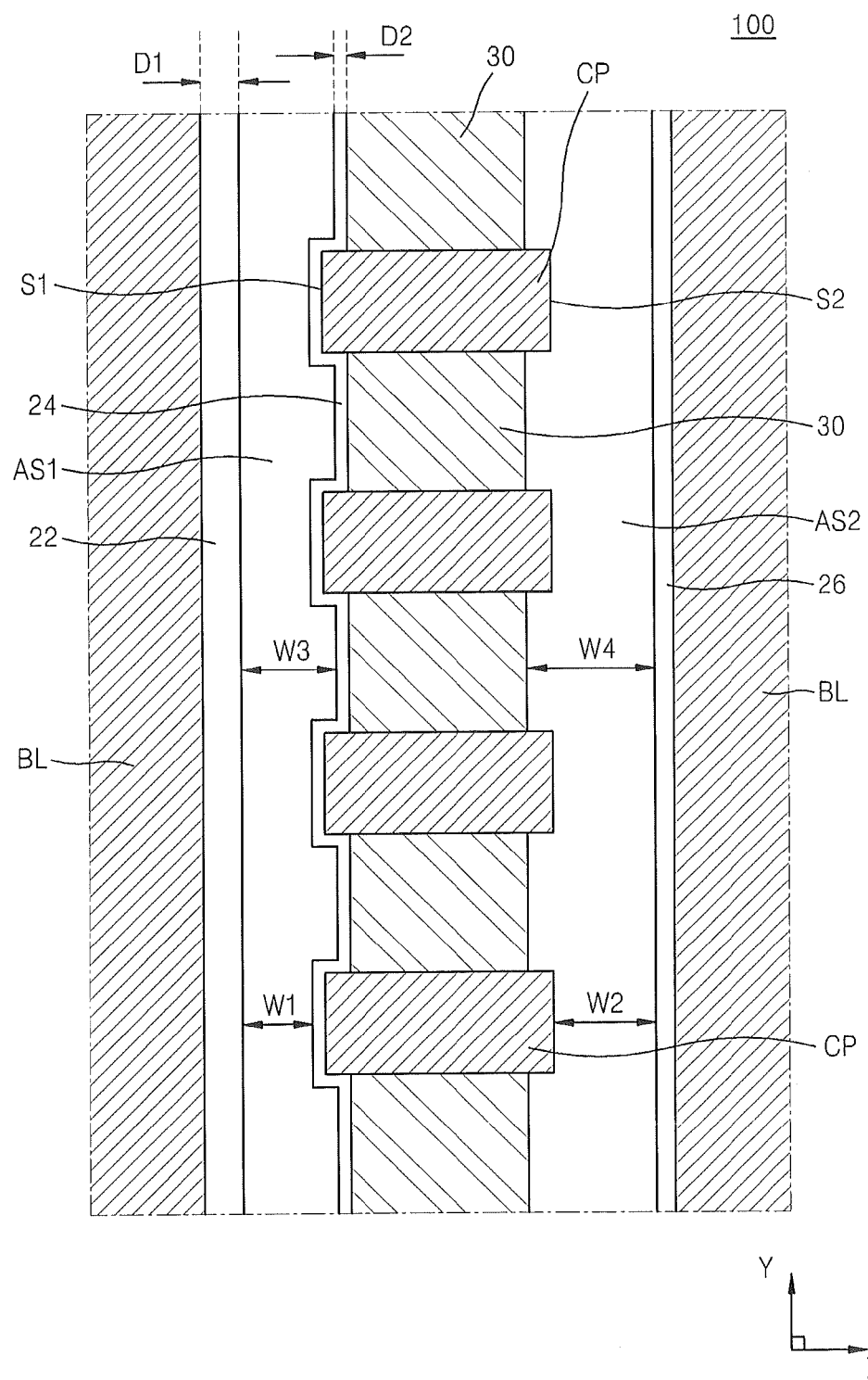
FIG. 2B is a plan view of the semiconductor device taken along a line B-B' of FIG. 2A.

FIG. 2A is a cross-sectional view of the semiconductor device 100 of FIG. 1 taken along a line A-A' of FIG. 1, and FIG. 2B is a plan view of the semiconductor device 100 taken along a line B-B' of FIG. 2A.

Referring to FIGS. 2A and 2B, a plurality of contact plugs CP may be interposed between two adjacent bit line stack structures 10. Each of the bit line stack structures 10 may include a bit line BL and an insulating capping line 12 covering the bit line BL. As shown in FIG. 2B, a plurality of contact plugs CP may be arranged in a row between two adjacent bit lines BL in a direction in which the bit lines BL extend. The plurality of contact plugs CP may be disposed at regular intervals. A plurality of buried insulating patterns 30 may be interposed between the contact plugs CP disposed between two adjacent bit lines BL.

A first air space AS1 and a second air space AS2 may be disposed on opposite sides of each of the contact plugs CP. The first and second air spaces AS1 and AS2 may have asymmetric shapes on both sides of the contact plug CP.

The plurality of contact plugs CP may have a different width from the plurality of buried insulating patterns 30 in a direction (an X direction of FIG. 2B) orthogonal to a direction (refer to a Y direction of FIG. 2B) in which the bit line BL extends. FIG. 2B shows an example in which the plurality of contact plugs CP has a greater width than the plurality of buried insulating patterns 30, but the inventive concept is not limited thereto. For example, the plurality of contact plugs CP may have a width equal to or smaller than that of the plurality of buried insulating patterns 30.

The first and second air spaces AS1 and AS2 disposed on both sides of the plurality of contact plugs CP may respectively have a first width W1 and a second width W2, which may be different from each other. As shown in FIGS. 2A and 2B, the first width W1 may be smaller than the second width W2. However, the inventive concept is not limited thereto. In some other embodiments, the first width W1 may be equal to or greater than the second width W2.

The first and second air spaces AS1 and AS2 disposed on both sides of the plurality of buried insulating patterns 30 may respectively have a third width W3 and a fourth width W4, which may be different form each other. As shown in FIG. 2B, the third width W3 may be smaller than the fourth width W4. However, the inventive concept is not limited thereto. In some other embodiments, the third width W3 may be equal to or greater than the fourth width W4.

One sidewall of the bit line BL may be covered with a first insulating layer 22. One sidewall of the contact plug CP may be covered with a second insulating layer 24. The first insulating layer 22 and the second insulating layer 24 may be exposed on an inner wall of the first air space AS1 formed between the first sidewall S1 of the contact plug CP and the bit line BL facing the first sidewall S1. As shown in FIGS. 2A and 2B, a thickness D1 of the first insulating layer 22 may be greater than a thickness D2 of the second insulating layer 24. However, the inventive concept is not limited thereto. For instance, the thickness D1 of the first insulating layer 22 may be equal to or smaller than the thickness D2 of the second insulating layer 24.

Another sidewall of the bit line BL may be covered with a third insulating layer 26. The third insulating layer 26, the sidewall of the contact plug CP, and the sidewall of the buried insulating pattern 30 may be exposed on an inner wall of the second air space AS2 formed between a second sidewall S2, which is the opposite side of the first sidewall S1 of the contact plug CP, and the bit line BL facing the second sidewall S2.

In some embodiments, at least one of the first and second air spaces AS1 and AS2 may have a non-uniform width in a direction in which the bit line BL extends. In some other embodiments, any one of the first and second air spaces AS1 and AS2 may have a constant width in a lengthwise direction (refer to a Y direction of FIG. 2B) thereof, and the other thereof may have a non-uniform width in the lengthwise direction thereof.

In FIG. 2B, on both sides of the contact plugs CP arranged in a row in the direction (refer to the Y direction of FIG. 2B) in which the bit line BL extends, the first air space AS1 facing the first sidewall S1 and the second air space AS2 facing the second sidewall S2 may have non-uniform widths in the direction in which the bit lines BL extend. However, the inventive concept is not limited to the example shown in FIGS. 2A and 2B, and any one of the first and second air spaces AS1 and AS2 may extend to have a uniform width along the direction in which the bit lines BL extend.

Each of the first insulating layer 22, the second insulating layer 24, and the third insulating layer 26 may be a single layer formed of one material or a multi-layered structure formed of two different materials. In some embodiments, at least one of the first through third insulating layers 22, 24, and 26 may intermittently extend in the lengthwise direction thereof.

FIGS. 3A through 14D are cross-sectional views illustrating operations for manufacturing a semiconductor device 200 (refer to FIGS. 14A through 14D) according to exemplary embodiments of the inventive concept.

The semiconductor device 200 may have the layout shown in FIG. 1. FIGS. 3A through 14A are cross-sectional views taken along line A-A' of FIG. 1, and FIGS. 3B through 14B are cross-sectional views taken along line C-C' of FIG. 1. In FIGS. 3A through 14D, the same reference numerals are used to denote the same items as in FIGS. 1, 2A, and 2B, and a detailed description of the same items will be omitted.

Referring to FIGS. 3A and 3B, isolation trenches 112 may be formed in a semiconductor substrate 110, and isolation regions 114 may be formed within the isolation trenches 112. A plurality of active regions 116 may be defined by the isolation regions 114 in the substrate 110. The plurality of active regions 116 may have elongate island shapes having a minor axis and a major axis.

The substrate 110 may include silicon (Si), for example, crystalline silicon, polycrystalline silicon (poly-Si), or amorphous silicon (a-Si). In some other embodiments, the substrate 310 may include germanium (Ge) or a compound semiconductor, such as silicon germanium (SiGe), silicon carbide (SiC), gallium arsenide (GaAs), indium arsenide (InAs), or indium phosphide (InP). In some embodiments, the substrate 110 may include a conductive region, for example, a doped well or a doped structure.

Each of the isolation regions 114 may include a first insulating layer 114A and a second insulating layer 114B. The first and second insulating layers 114A and 114B may include different materials. For example, the first insulating layer 114A may include an oxide layer, and the second insulating layer 114B may include a nitride layer. However, the inventive concept is not limited to the above-described construction of the isolation regions 114. For instance, the isolation regions 114 may include a single layer including one insulating layer or a multi-layered structure including at least three kinds of insulating layers.

A plurality of word line trenches 118 may be formed in the substrate 110. The plurality of word line trenches 118 may extend parallel to one another and have line shapes intersecting the plurality of active regions 116, respectively.

As shown in FIG. 3B, to form the plurality of word line trenches 118 having stepped bottom surfaces, the isolation regions 114 and the substrate 110 may be etched using separate etching processes so that the isolation regions 114 can be etched to a different depth from the substrate 110.

After the resultant structure having the plurality of word line trenches 118 is cleaned, a plurality of gate dielectric layers 120, a plurality of word lines 122, and a plurality of buried insulating layers 124 may be sequentially formed within the plurality of word line trenches 118.

In some embodiments, after the word lines 122 are formed, impurity ions may be implanted into the substrate 110 on both sides of the word lines 122 so that source and drain regions (not shown) can be formed in top surfaces of the plurality of active regions 116. In some other embodiments, before the plurality of word lines 122 are formed, an ion implantation process for forming source and drain regions may be performed.

Each of top surfaces 122T of the plurality of word lines 122 may be disposed at a lower level than a top surface 110T of the substrate 110. Bottom surfaces of the plurality of word lines 122 may have rough shapes, and saddle fin field effect transistors (saddle FinFETs) may be formed in the plurality of active regions 116. In some embodiments, the plurality of word lines 122 may include at least one material selected from the group consisting of titanium (Ti), titanium nitride (TiN), tantalum (Ta), tantalum nitride (TaN), tungsten (W), tungsten nitride (WN), titanium silicon nitride (TiSiN), or tungsten silicon nitride (WSiN).

The gate dielectric layer 120 may include at least one selected from the group consisting of a silicon oxide layer, a silicon nitride layer, a silicon oxynitride layer, an oxide/nitride/oxide (ONO) layer, or a high-k dielectric layer having a higher dielectric constant than a silicon oxide layer. For example, the gate dielectric layer 120 may have a dielectric constant of about 10 to about 25. In some embodiments, the gate dielectric layer 120 may include at least one selected from the group consisting of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). For example, the gate dielectric layer 120 may include $HfO_2$, $Al_2O_3$, $HfAlO_3$, $Ta_2O_3$, or $TiO_2$.

Top surfaces 124T of the plurality of buried insulating layers 124 may be disposed at about the same level as the top surface 110T of the substrate 110. The buried insulating layers 124 may include a silicon oxide layer, a silicon nitride layer, a silicon oxynitride layer, or a combination thereof.

An interlayer insulating pattern 130 may be formed on the substrate 110. The interlayer insulating pattern 130 may be formed to a thickness of about 200 Å to about 400 Å. The interlayer insulating pattern 130 may include silicon oxide. For example, the interlayer insulating pattern 130 may include tetraethylorthosilicate (TEOS), high-density plasma (HDP), or boro-phospho silicate glass (BPSG).

The interlayer insulating pattern 130 may include a plurality of openings 130H exposing a plurality of source regions 116S out of the plurality of active regions 116.

Afterwards, the plurality of openings 130H formed in the interlayer insulating pattern 130 may be filled with a conductive material to form a plurality of direct contacts 132. The plurality of direct contacts 132 may be electrically connected to the source regions 116S of the active regions 116.

A plurality of bit line stack structures 140 may be formed on the interlayer insulating pattern 130 and the plurality of direct contacts 132 and extend parallel to one another. The plurality of bit line stack structures 140 may include a plurality of bit lines 142 and a plurality of insulating capping lines 144 covering top surfaces of the plurality of bit lines 142. The plurality of bit lines 142 may be electrically connected to the plurality of direct contacts 132.

In some embodiments, the plurality of bit lines 142 may include at least one material selected from the group consisting of a doped semiconductor, a metal, a metal nitride, or a metal silicide. For example, each of the plurality of bit lines 142 may include a stack structure including doped poly-Si, tungsten nitride, and tungsten stacked sequentially.

In some embodiments, the plurality of insulating capping lines 144 may include a silicon nitride layer. The plurality of insulating capping lines 144 may have a greater thickness than the plurality of bit lines 142.

In some embodiments, to form the plurality of bit line stack structures 140, a conductive layer for forming bit lines may be formed on the interlayer insulating pattern 130, and an insulating layer may be formed to cover the conductive layer. The insulating layer may have a greater thickness than the conductive layer for forming the bit lines. The insulating layer may be patterned to form the plurality of insulating capping lines 144, and the conductive layer for forming the bit lines may be etched using the plurality of insulating capping lines 144 as an etch mask, thereby forming the plurality of bit lines 142. In some embodiments, a portion of the interlayer insulating pattern 130 may be etched due to overetching during the etching of the conductive layer for forming the bit lines so that a stepped portion may be formed in a top surface of the interlayer insulating pattern 130.

In some embodiments, the conductive layer for forming the bit lines may include a multi-layered structure. For instance, the conductive layer for forming the bit lines may have a multi-layered structure formed by sequentially stacking a first metal silicide layer, a conductive barrier layer, a second metal silicide layer, and an electrode layer formed of a metal or a metal nitride.

Line-shaped spaces 146 may remain between the respective bit line stack structures 140.

Figure 4A:
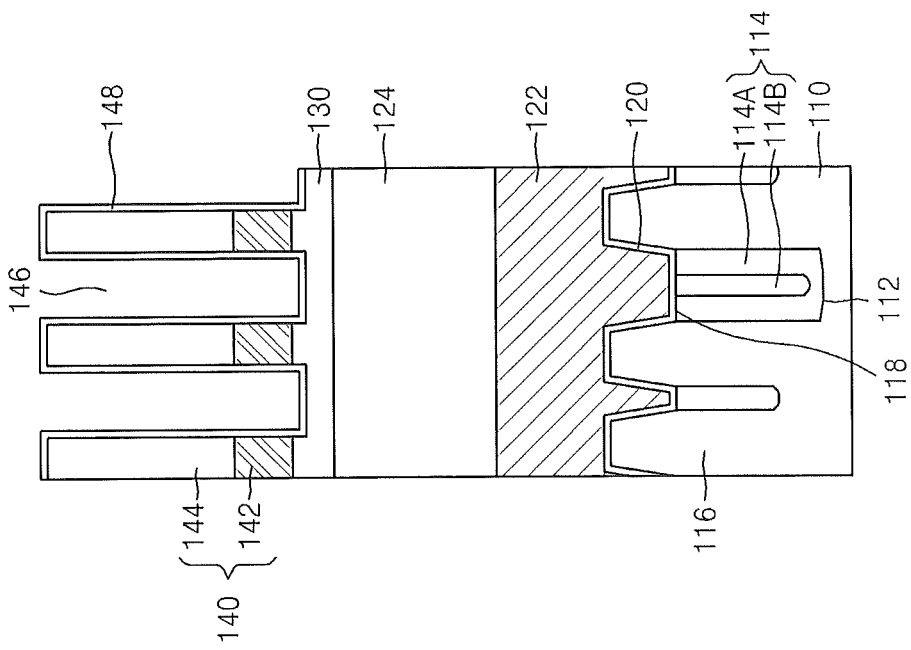
Figure 4B:
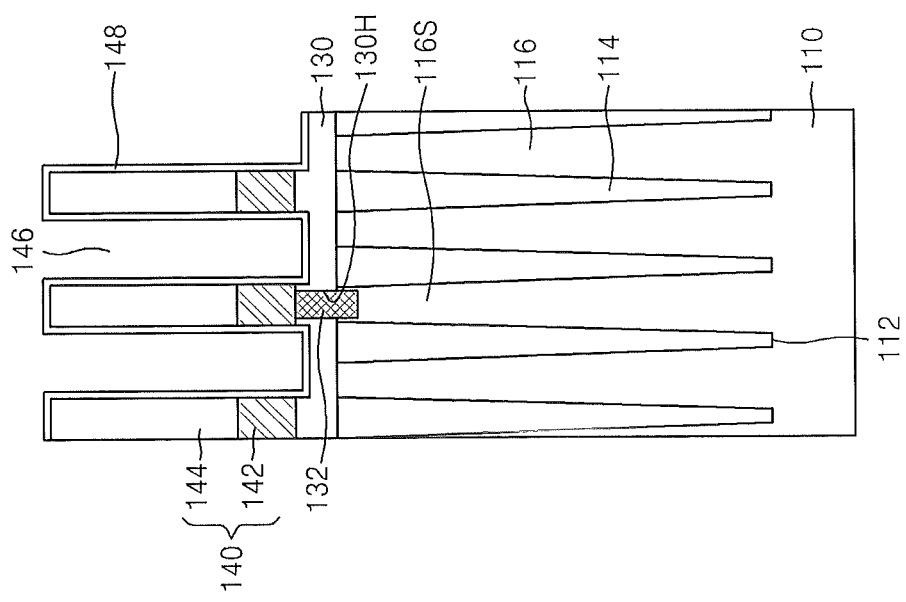

Referring to FIGS. 4A and 4B, an insulating liner 148 may be formed to cover exposed top surfaces and sidewalls of the plurality of bit line stack structures 140 and an exposed surface of the interlayer insulating pattern 130. In some embodiments, the insulating liner 148 may be used as an etch stop layer during a subsequent process. The insulating liner 148 may be used as a protection layer for protecting the plurality of bit line stack structures 140. In some embodiments, the insulating liner 148 may include a silicon nitride layer. In some embodiments, the insulating liner 148 may be used as a sacrificial layer for forming expanded air spaces AS12 (refer to FIGS. 13A through 13D) during a subsequent process. The insulating liner 148 may be formed to a thickness of about 30 Å to about 80 Å.

Figure 5A:
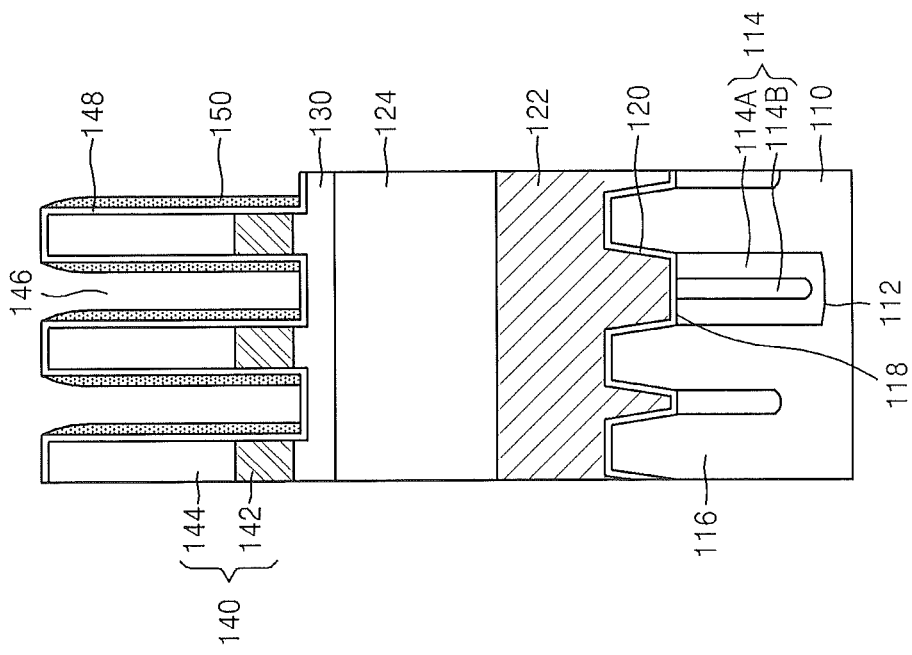
Figure 5B:
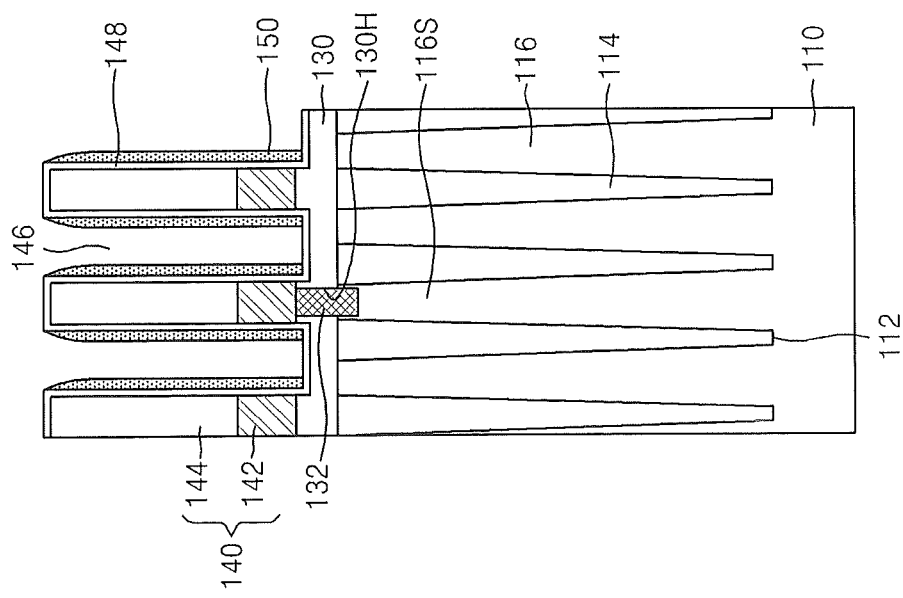

Referring to FIGS. 5A and 5B, a first sacrificial layer may be deposited on the resultant structure having the insulating liner 148 and etched back using the insulating liner 148 as an etch stop layer, so that a plurality of sacrificial spacers 150 can be formed on both sidewalls of the plurality of bit line stack structures 140 to cover the insulating, liner 148. In some embodiments, the plurality of sacrificial spacers 150 may include silicon oxide, a SiGe compound, or a polymer. However, the inventive concept is not limited thereto. The plurality of sacrificial spacers 150 may include a material having an etch selectivity with respect to the insulating liner 148. For example, the plurality of sacrificial spacers 150 may include an insulating material or a conductive material.

Figure 6A:
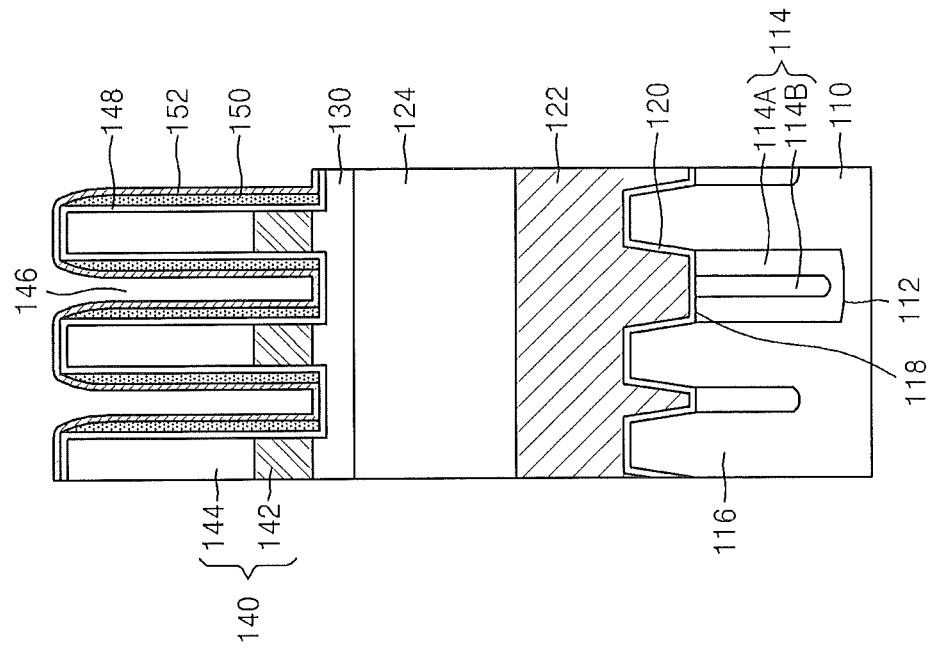
Figure 6B:
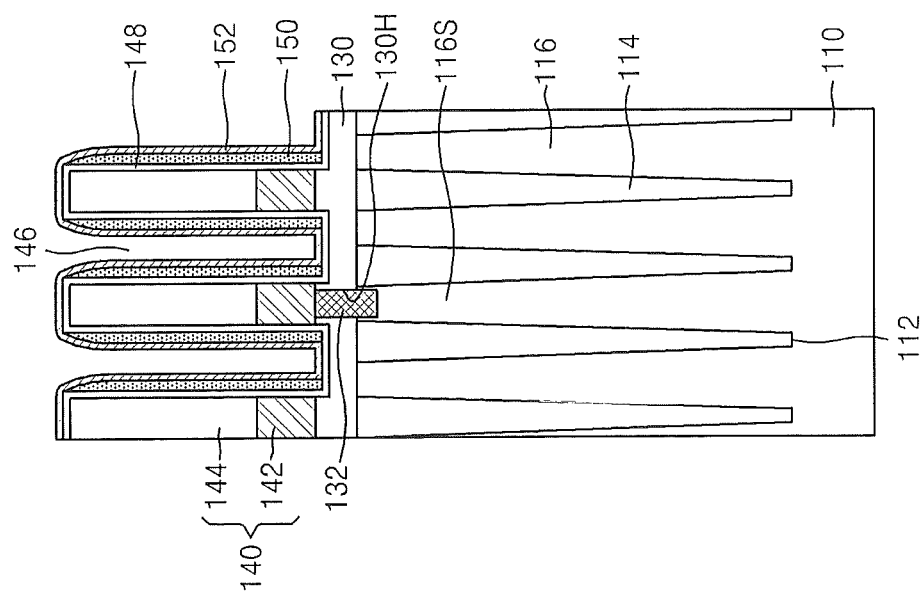

Referring to FIGS. 6A and 6B, a second sacrificial layer 152 may be formed in the spaces 146 to cover the plurality of sacrificial spacers 150.

The second sacrificial layer 152 may cover the insulating liner 148 and the plurality of sacrificial spacers 150 to a uniform thickness. The second sacrificial layer 152 may include a different material from the plurality of sacrificial spacers 150. In some embodiments, the second sacrificial layer 152 may include an oxide layer, a nitride layer, or a silicon oxynitride layer. The second sacrificial layer 152 may be formed to a thickness of about 20 Å to about 100 Å.

Referring to FIGS. 7A and 7B, insulating lines 154 may be formed in the spaces 146.

In some embodiments, to form the insulating lines 154, an insulating layer may be formed on the resultant structure having the second sacrificial layer 152 to fill the spaces 146. Thereafter, the insulating layer may be etched back using an etchback process or a chemical mechanical polishing (CMP) process until top surfaces of the plurality of insulating capping lines 144 are exposed, so that the insulating lines 154 can remain in the spaces 146. The insulating lines 154 may include a nitride layer.

Figure 8A:
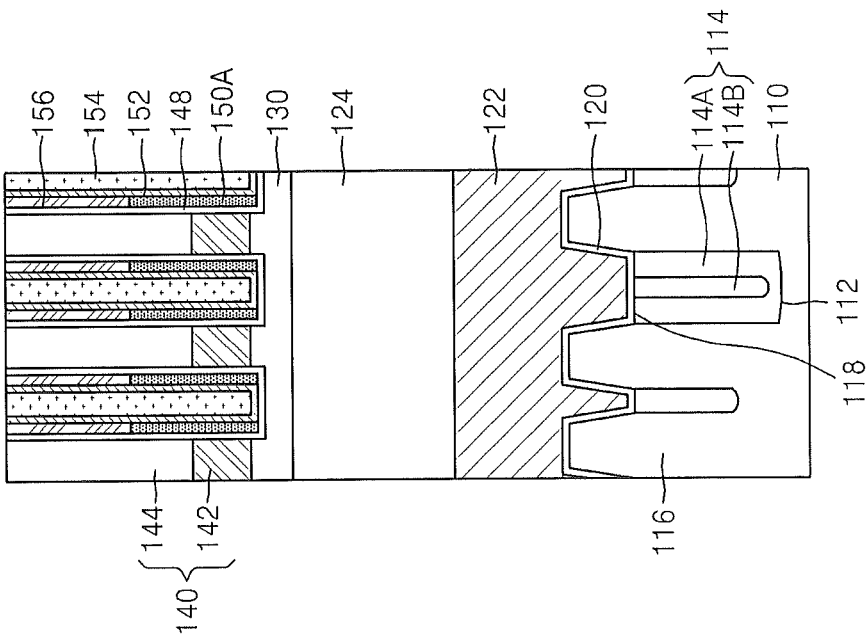
Figure 8B:
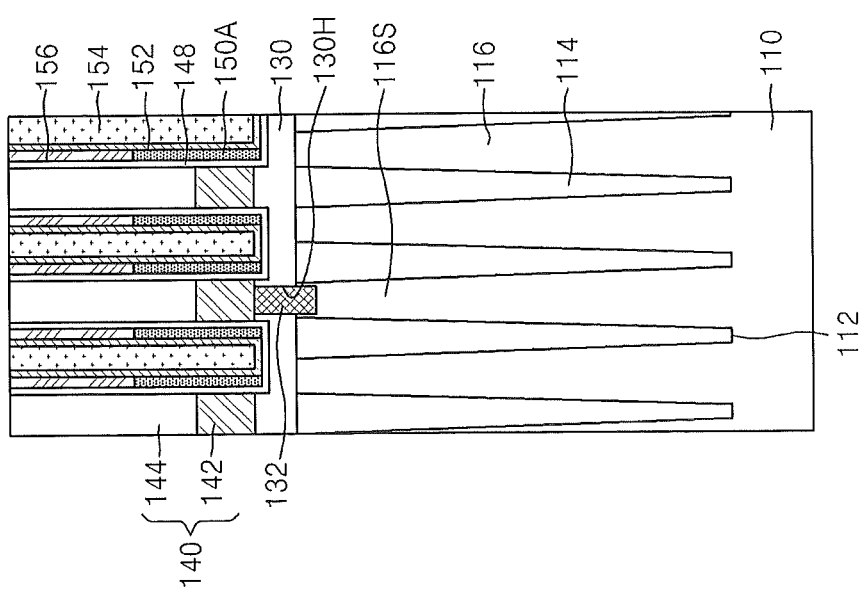

Referring to FIGS. 8A and 8B, the plurality of sacrificial spacers 150 may be etched to a predetermined depth from the top surfaces thereof. Thus, a plurality of sacrificial spacer patterns 150A having a smaller height than the plurality of sacrificial spacers 150 may be formed.

Top surfaces of the plurality of sacrificial spacer patterns 150A may be disposed at a higher level than the top surfaces of the plurality of bit lines 142, but the inventive concept is not limited thereto. For example, the top surfaces of the sacrificial spacer patterns 150A may be disposed at the same level as or a lower level than the top surfaces of the plurality of bit lines 142.

The plurality of sacrificial spacers 150 may be etched to a predetermined depth using a dry etching process or a wet etching process to form the plurality of sacrificial spacer patterns 150A.

Afterwards, a support material layer may be formed on the substrate 110 and partially removed using an etchback process or a CMP process until top surface of the insulating lines 154 are exposed, thereby forming a plurality of support layers 156 covering the plurality of sacrificial spacer patterns 150A.

Each of the plurality of support layers 156 may have a line shape extending in the lengthwise direction of the bit line stack structures 140, which corresponds to the Y direction of FIG. 1. In some embodiments, the plurality of support layers 156 may include an insulating material. For example, the plurality of support layers 156 may include at least one material selected from SiN, SiCN, SiOC, SiON, SiOCN, TiO, TaO, TaTiO, TaSiO, and A10.

Figure 9A:
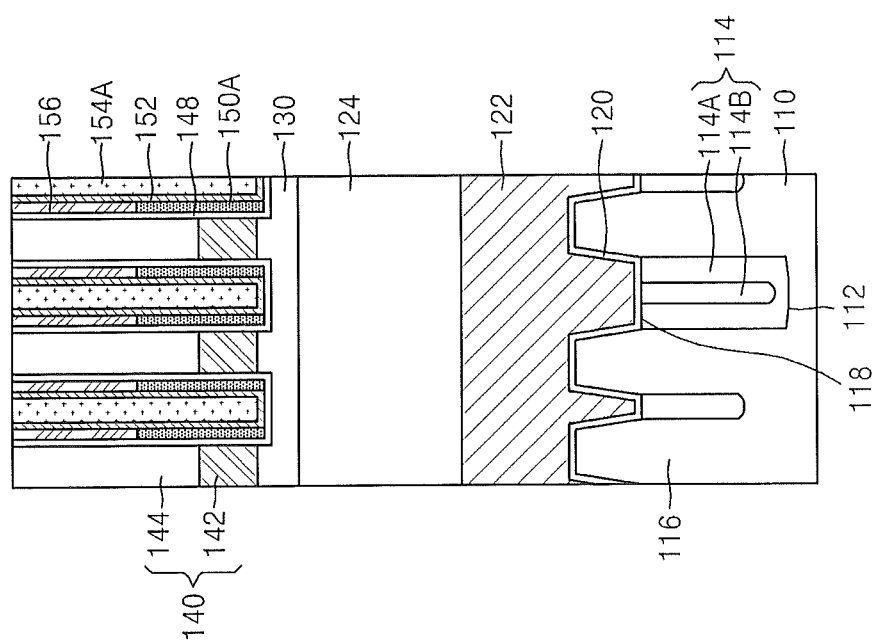
Figure 9B:
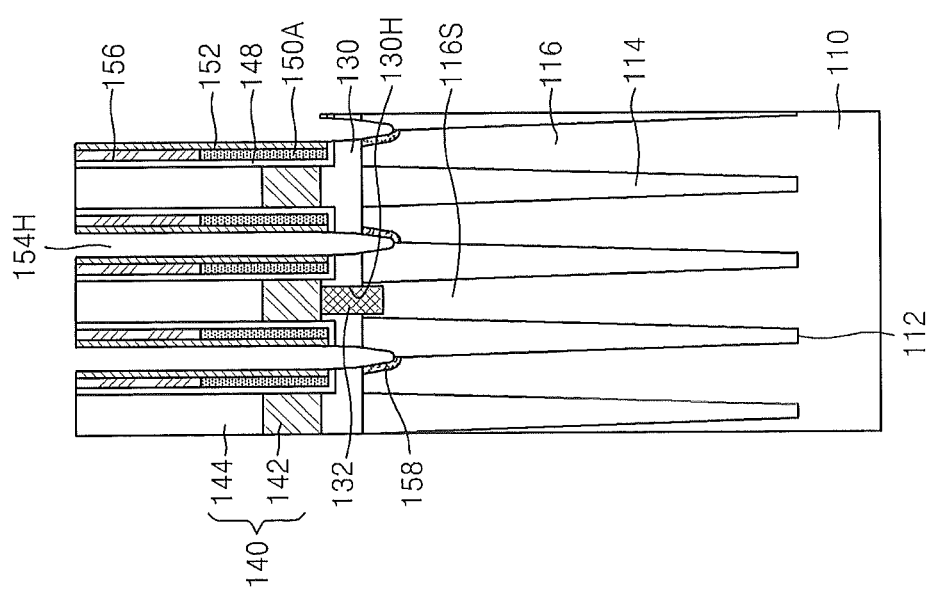

Referring to FIGS. 9A and 9B, a mask pattern (not shown) having a predetermined shape may be formed on the resultant structure having the plurality of insulating lines 154, and partially removed using the mask pattern as an etch mask, thereby forming a plurality of insulating patterns 154A defining a plurality of contact holes 154H. Thereafter, the mask pattern may be removed.

The second sacrificial layer 152, the insulating liner 148, the interlayer insulating pattern 130, and a portion of the substrate 110, which are exposed through the plurality of contact holes 154H, may be sequentially etched, thereby exposing the substrate 110 on a bottom surface of each of the plurality of contact holes 15414.

A metal silicide layer 158 may be formed on the surface of the substrate 110 exposed on the bottom surface of each of the plurality of contact holes 15411. For instance, the metal silicide layer 158 may include cobalt silicide. However, the inventive concept is not limited thereto, and the metal silicide layer 158 may include a material selected out of various kinds of metal sificides.

In some embodiments, the following processes may be performed to form the metal silicide layer 158. Initially, a metal layer may be deposited on the surface of the substrates 110 exposed on the bottom surface of each of the plurality of contact holes 154H, and a first rapid thermal silicidation (RTS) process may be performed. The first RTS process may be performed at a temperature of about 450° C. to about 550° C. The metal layer, which did not react with Si atoms, may be removed during the first RTS process, and a second RTS process may be performed at a temperature of, for example, about 800° C. to about 950° C., which is higher than in the first RTS process, to form the metal silicide layer 158. When a cobalt layer is formed as the metal layer, a cobalt silicide layer may be formed as the metal silicide layer 158.

Figure 10A:
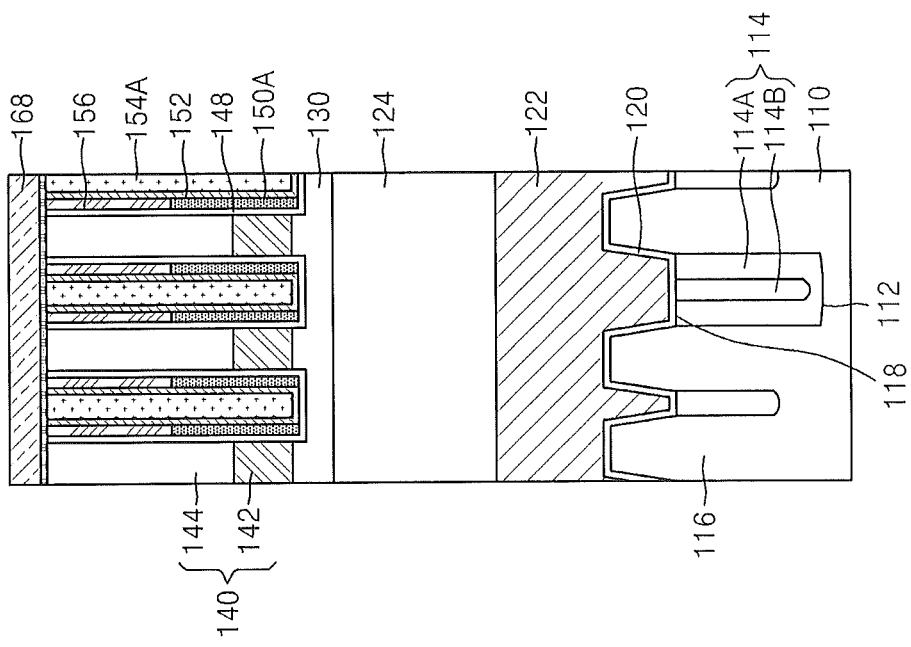
Figure 10B:
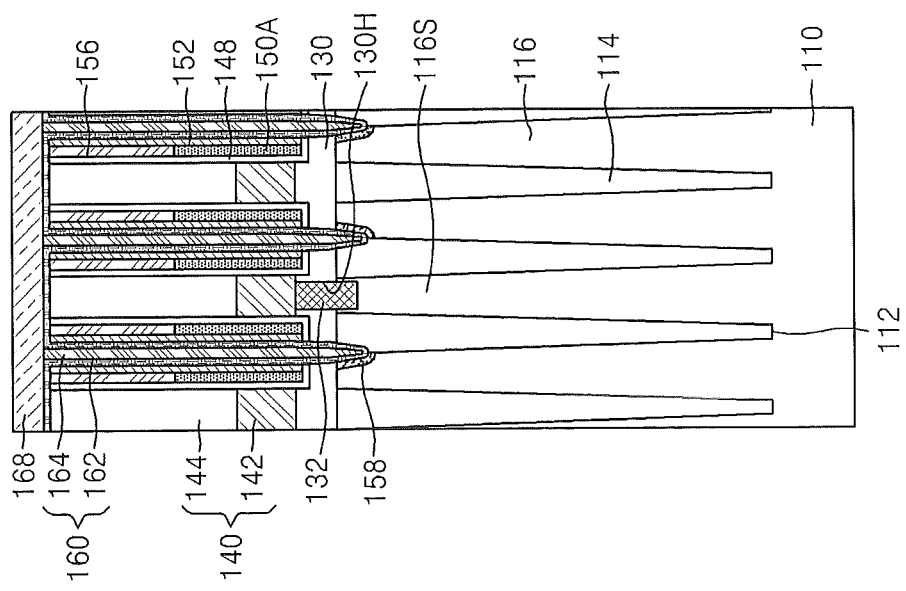

Referring to FIGS. 10A and 10B, the plurality of contact holes 154H may be filled with a conductive material to form a plurality of contact plugs 160, and a pad conductive layer 168 may be formed on the plurality of contact plugs 160.

Each of the plurality of contact plugs 160 may include a barrier layer 162 covering inner walls of the plurality of contact holes 154H and a conductive plug 164 disposed on the barrier layer 162 to fill the corresponding contact hole 154H.

In some embodiments, the following processes may be performed to form the plurality of contact plugs 160 and the pad conductive layer 168. Initially, after the resultant structure having the plurality of contact holes 154H is cleaned, a barrier layer 162 may be formed on the entire surface of the resultant structure cover the inner walls of the plurality of contact holes 154H. Thereafter, a first conductive layer may be formed on the barrier layer 162 to such a sufficient thickness as to fill the inside of each of the plurality of contact holes 154H. After that, the first conductive layer may be etched back or polished until the barrier layer 162 is exposed, thereby forming the plurality of conductive plugs 164 within the plurality of contact holes 154H. Subsequently, a second conductive layer may be formed on the plurality of conductive plugs 164, and a top surface of the second conductive layer may be planarized to form the pad conductive layer 168.

In some embodiments, the barrier layer 162 may have a titanium/titanium nitride (Ti/TiN) stack structure. The plurality of contact plugs 160 may include doped poly-Si, a metal, a metal silicide, a metal nitride, or a combination thereof. The pad conductive layer 168 may include a metal, a metal nitride, or a combination thereof. For instance, at least one of the contact plugs 160 and the pad conductive layer 168 may include tungsten.

Figure 11A:
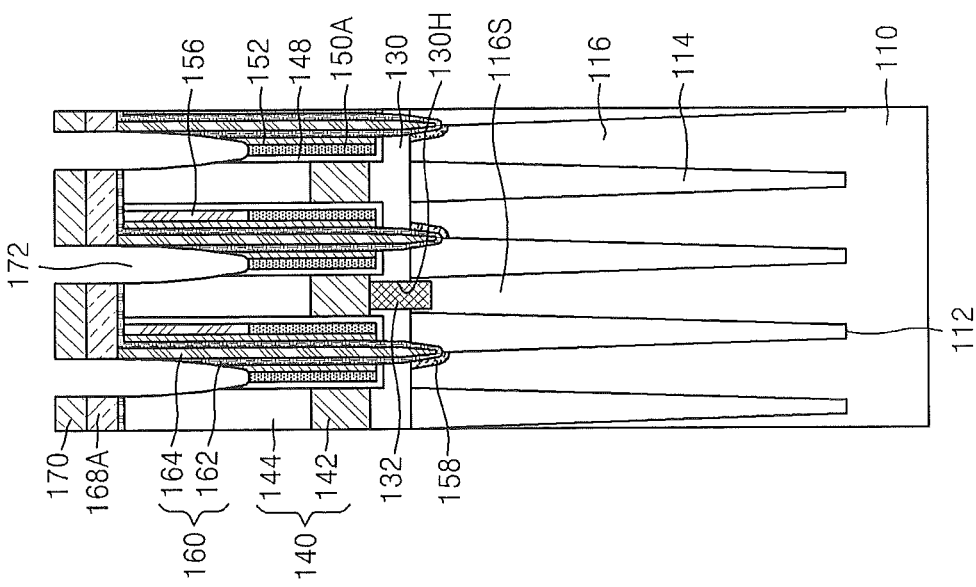
Figure 11B:
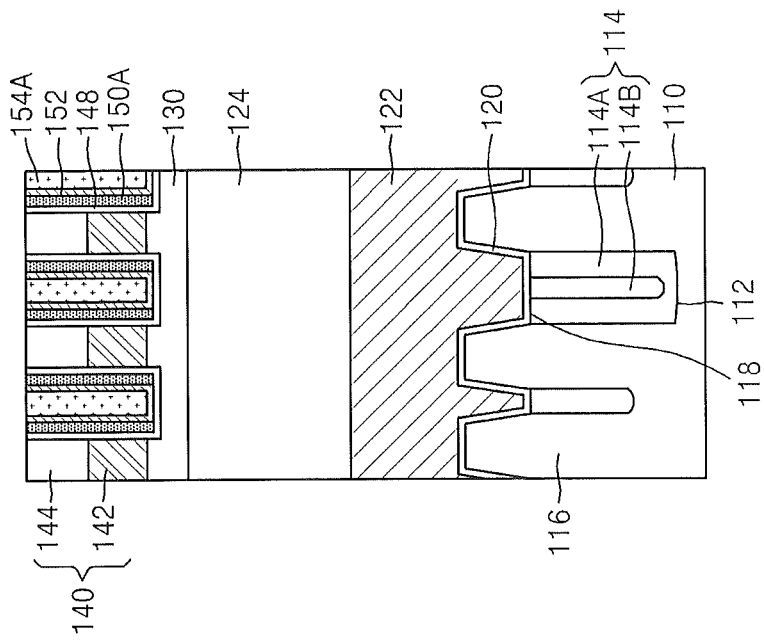

Referring to FIGS. 11A and 11B, a mask pattern 170 may be formed on the pad conductive layer 168, and the pad conductive layer 168 and the barrier layer 162 may be etched using the mask pattern 170 as an etch mask, thereby forming a plurality of landing pads 168A to be respectively connected to the plurality of contact plugs 160. Portions of the insulating capping lines 144 exposed through the plurality of landing pads 168A, portions of the plurality of contact plugs 160, and a portion of each of the insulating liner 148, the second sacrificial layer 152, and the support layer 156 may be removed to form a plurality of upper spaces 172 exposing the plurality of sacrificial spacer patterns 150A.

In some embodiments, like the plurality of contact plugs CP shown in FIG. 1, the plurality of mask patterns 170 may have island shapes separated from one another. The plurality of mask patterns 170 may include a silicon nitride layer.

Figure 12B:
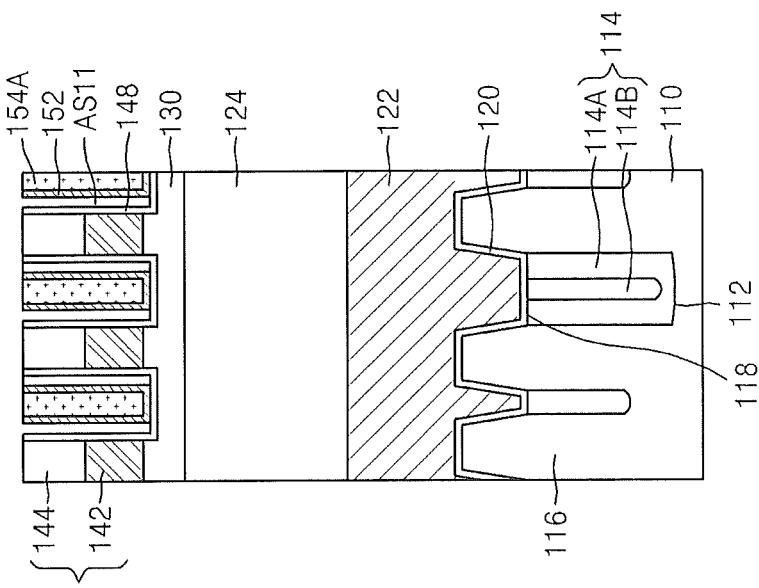
Figure 12A:
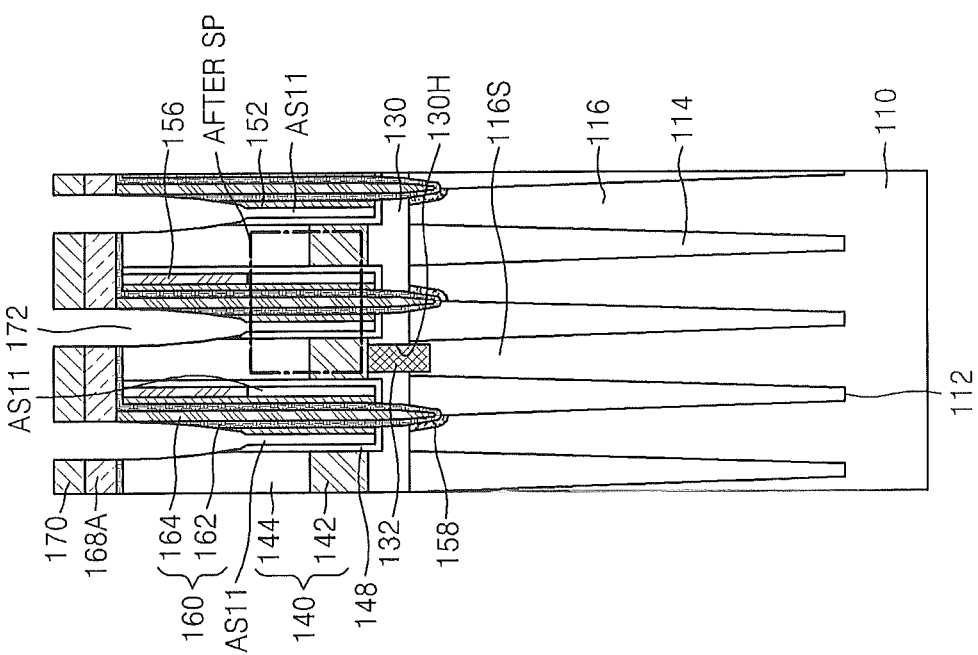

Referring to FIGS. 12A and 12B, the plurality of sacrificial spacer patterns 150A exposed through the plurality of upper spaces 172 may be removed, thereby forming a plurality of air spaces AS11 between the plurality of bit line stack structures 140 and the plurality of contact plugs 160. The plurality of sacrificial spacer patterns 150A may be removed using a wet etching process or a dry etching process.

Figure 12C:
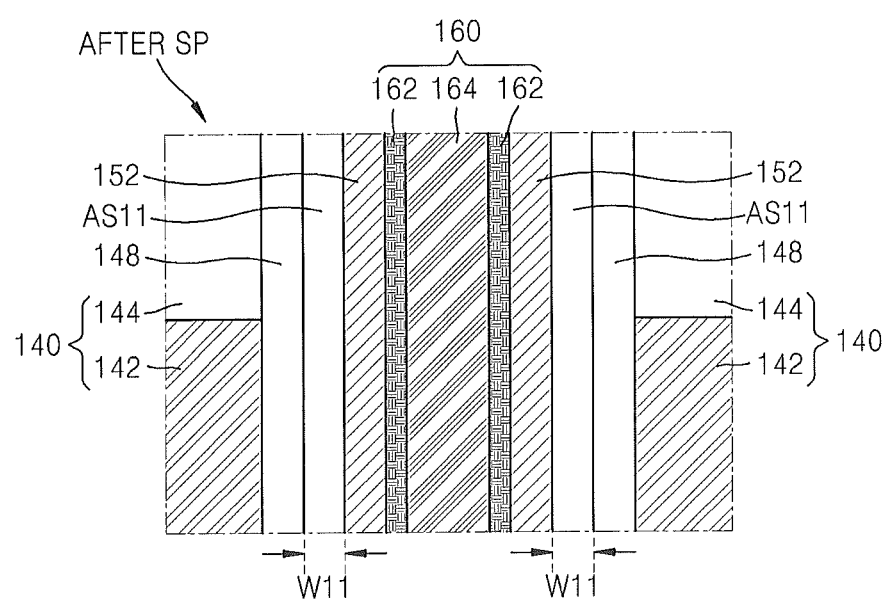
Figure 12D:
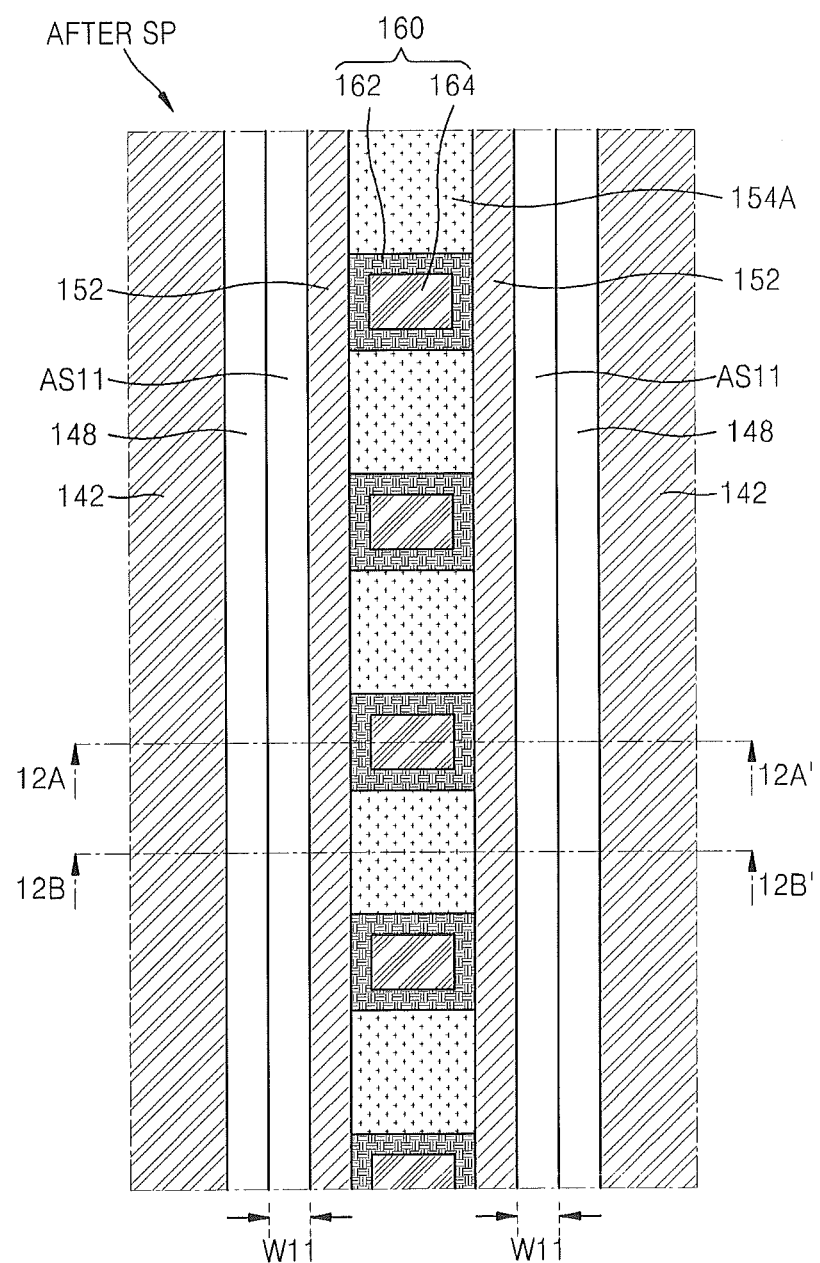

FIG. 12C is an enlarged cross-sectional view of a portion illustrated with a square AFTER SP of FIG. 12A. FIG. 12D is an enlarged plan view of the portion illustrated with the square AFTER SP of FIG. 12A.

Referring to FIGS. 12A through 12D, the insulating liner 148 and the second sacrificial layer 152 may be exposed on the plurality of air spaces AS11. The plurality of air spaces AS11 may have a first width W11 in a direction in which the word line 122 extends.

Referring to FIGS. 13A and 13B, a portion of each of the insulating liner 148 and the second sacrificial layer 152 exposed on the plurality of air spaces AS11 may be removed through the corresponding upper space 172 so that the width of the plurality of air spaces AS11 can be expanded to form a plurality of expanded air spaces AS12.

Figure 13C:
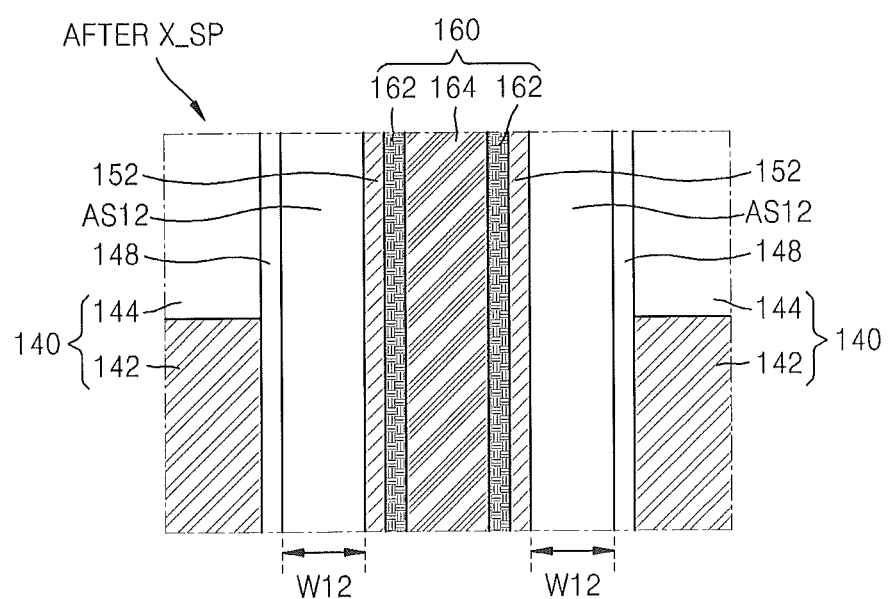
Figure 13D:
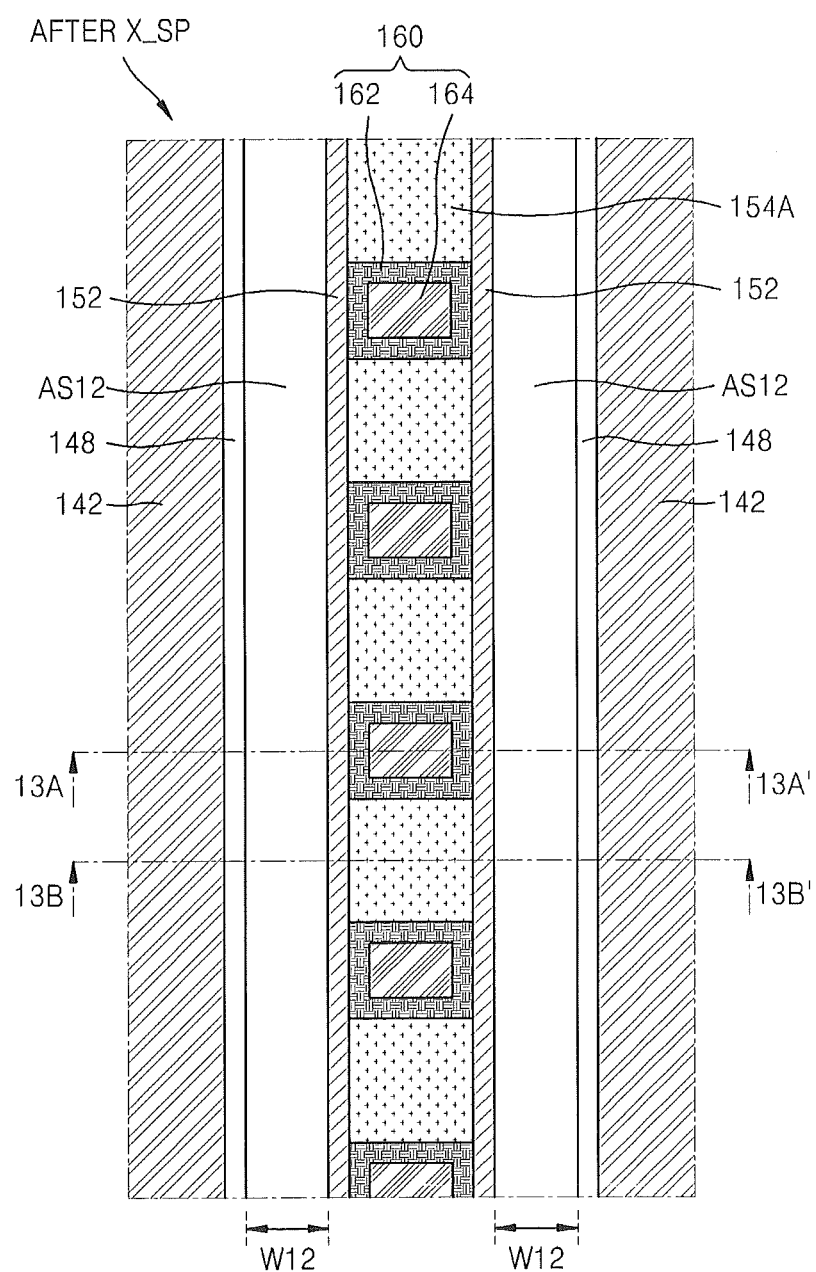

FIG. 13C is an enlarged cross-sectional view of a portion illustrated with a square AFTER X_SP of FIG. 13A. FIG. 13D is an enlarged plan view of the portion illustrated with the square AFTER X_SP of FIG. 13A.

Referring to FIGS. 13A through 13D, the insulating liner 148 and the second sacrificial layer 152 may be exposed on the plurality of expanded air spaces AS12.

The plurality of expanded air spaces AS12 may have a second width W12 greater than the first width W11 in the direction in which the word line 122 extends.

To form the plurality of expanded air spaces AS12, a portion of each of the insulating liner 148 and the second sacrificial layer 152 may be removed through the upper space 172 using a wet etching process or a dry etching process.

Figure 14B:
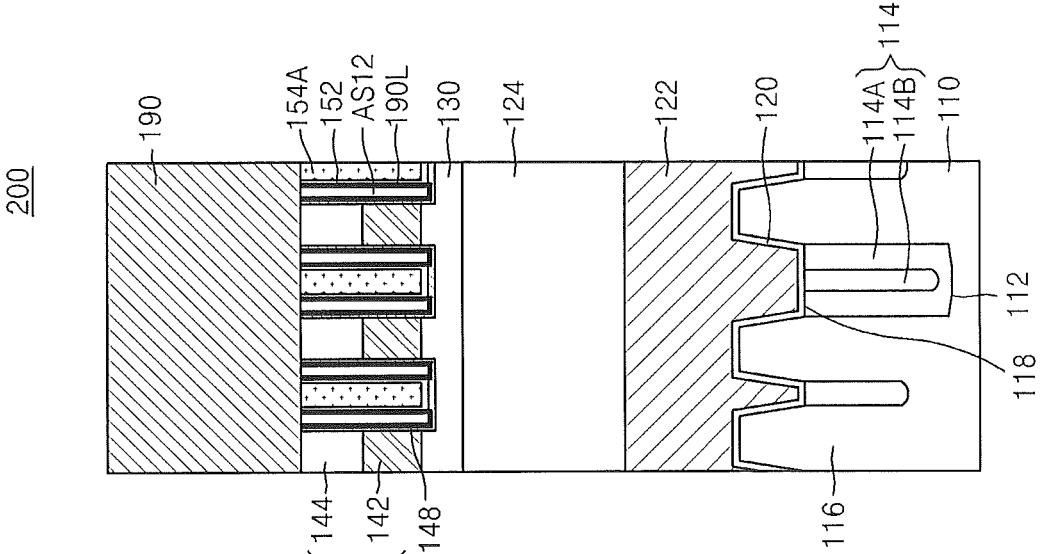
Figure 14A:
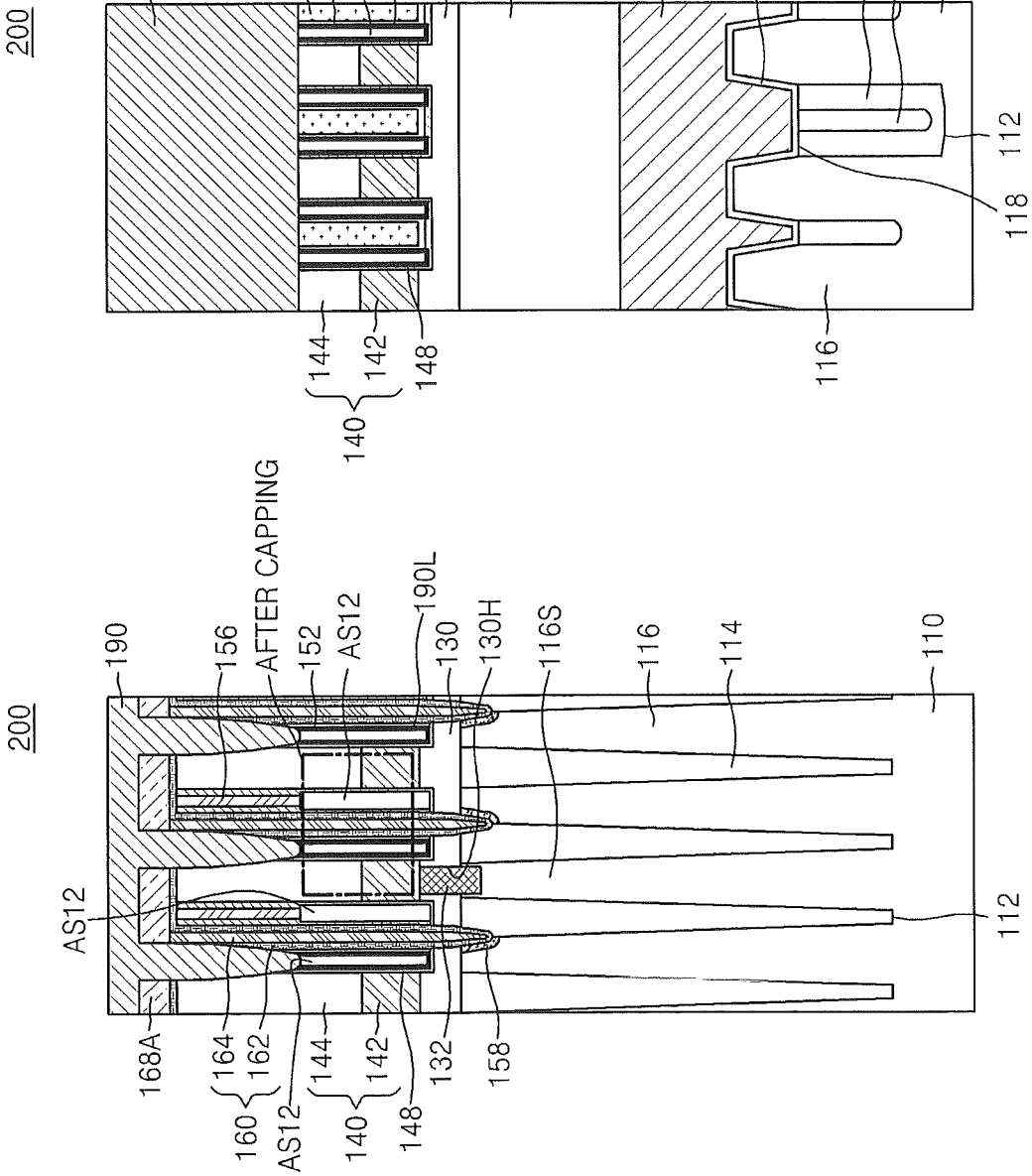

Referring to FIGS. 14A and 14B, after removing the mask pattern 170, an insulating material may be deposited on the substrate 110 to form a capping layer 190 filling the upper spaces 172.

During the formation of the capping layer 190, an insulating material may be deposited within the expanded air spaces AS12 from the upper space 172. As a result, a capping liner 190L may be formed of the same material as the capping layer 190 on inner walls of the expanded air spaces AS12 in regions except portions of the expanded air spaces AS12 that are covered with the plurality of landing pads 168A. However, the inventive concept is not limited thereto, and the capping liner 190L may not be necessarily formed. For example, portions of the inner walls of the expanded air spaces AS12 may not be covered with the capping liner 190L. Alternatively, the capping liner 190L may not be formed within the expanded air spaces AS12.

Figure 14C:
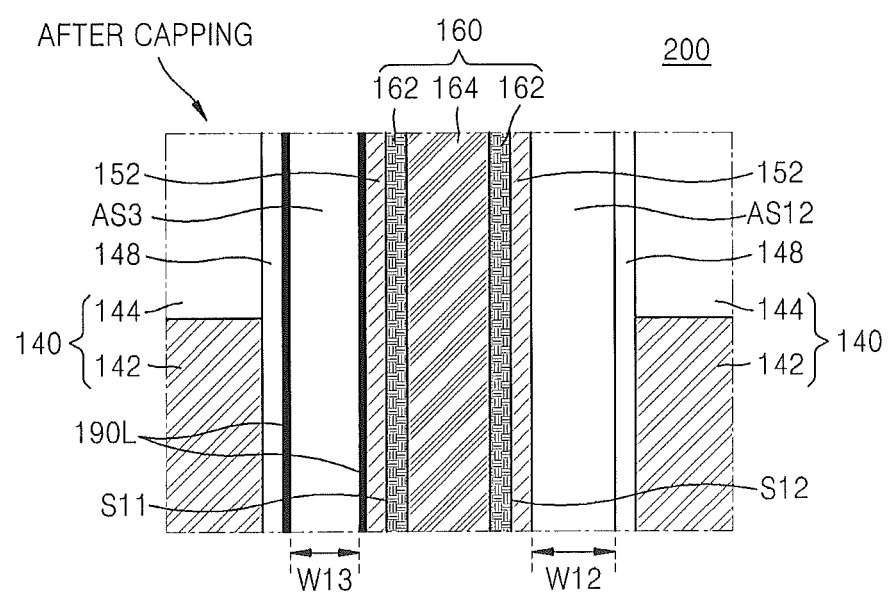
Figure 14D:
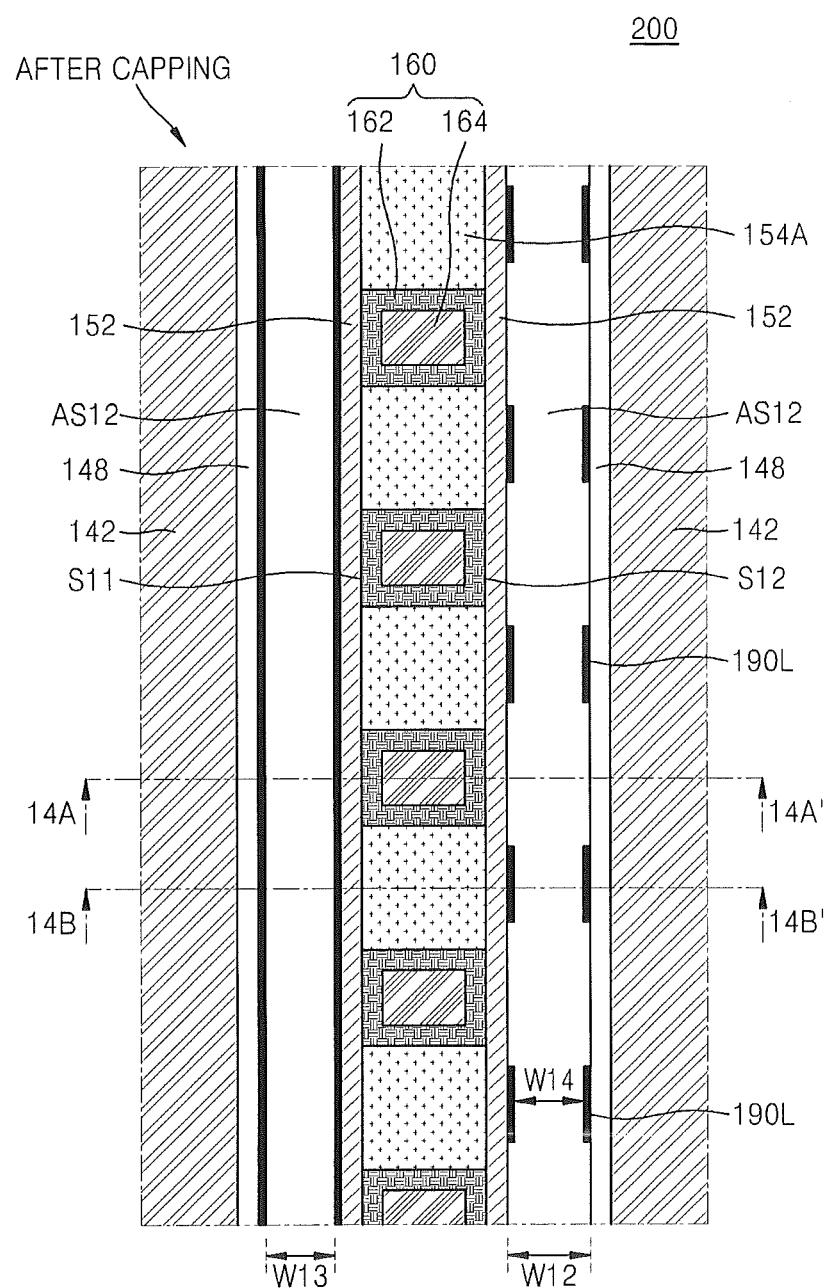

FIG. 14C is an enlarged cross-sectional view of a portion illustrated with a square AFTER CAPPING of FIG. 14A. FIG. 14D is an enlarged plan view of the portion illustrated with the square AFTER CAPPING of FIG. 14A.

Referring to FIGS. 14A through 14D, asymmetrical air spaces may be formed on both sides of one contact plug 160. That is, the capping liner 190L may be formed on the inner walls of the expanded air space AS12 between a first sidewall S11 (refer to FIGS. 14C and 14D0 of the contact plug 160 and the bit line 142 facing the first sidewall S11 so that the expanded air space AS12 can have a third width W13 smaller than the second width W12.

Since the expanded air space AS12 is covered with the landing pad 168A between a second sidewall S12 (refer to FIGS. 14C and 14D), which is the opposite side of the first sidewall S11 of the contact plug 160, and the bit line 142 facing the second sidewall S12, the capping liner 190L may not be formed on the inner walls of the expanded air space AS12. Accordingly, the expanded air space AS12 may maintain the second width W12 between the second sidewall S12 and the bit line 142 that face each other. As described above, the semiconductor device 200 including asymmetrical air spaces having different widths (i.e., the third width W13 and the second width W12) on both sides of one contact plug 160 may be manufactured.

In the present embodiment, the plurality of expanded air spaces AS12 may extend parallel to the bit lines 142, and at least one of the air spaces AS12 may have a non-uniform width in the lengthwise direction thereof. More specifically, as shown in FIG. 14D, based on the contact plugs 160 arranged in a row along the direction in which the bit lines 142 extend, the expanded air spaces AS12 facing the first sidewalls S11 may have a uniform width in the lengthwise direction thereof. In contrast, the expanded air spaces facing the second sidewalls S12 of the contact plugs 160 arranged in the row may have a non-uniform width along the lengthwise direction thereof due to the capping liner 190L that is intermittently formed on the second sacrificial layer 152 covering the insulating line 142. That is, the expanded air spaces AS12 may have a second width W12 between the contact plugs 160 and the bit lines 142 in the direction in which the word lines 122 extend, and have a fourth width W14, which is smaller than the second width W12, between the insulating patterns 154A and the bit lines 142.

Thereafter, a plurality of capacitors (not shown) may be formed through the capping layer 190 and electrically connected to the plurality of contact plugs 160. The plurality of bit lines 142 and the plurality of contact plugs 160 may constitute the plurality of bit lines BL and the plurality of contact plugs CP shown in FIG. 1.

FIGS. 15A through 20D are cross-sectional views of a method of manufacturing a semiconductor device 300 (refer to FIGS. 20A through 20D) according to further embodiments of the inventive concept.

The semiconductor device 300 may have the layout shown in FIG. 1. FIGS. 15A through 20A are cross-sectional views taken along line A-A' of FIG. 1, and FIGS. 15B through 20B are cross-sectional views taken along line C-C' of FIG. 1. In FIGS. 15A through 20D, the same reference numerals are used to denote the same items as in FIGS. 1 through 14D, and a detailed description of the same items will be omitted.

Referring to FIGS. 15A and 15B, the processes may be performed up until forming a plurality of contact holes 154H exposing a substrate 110 through bottom surfaces thereof in the same manner as described with reference to FIGS. 3A through 9B. Thereafter, a second sacrificial layer 152 exposed on sidewalls of the plurality of contact holes 154H may be removed so that sacrificial spacer patterns 150A and a support layer 156 can be exposed on the sidewalls of the plurality of contact holes 154H.

Next, a metal silicide layer 158 may be formed on the surface of the substrate 110 exposed on a bottom surface of each of the plurality of contact holes 154H in the same manner as described with reference to FIGS. 9A and 9B.

Figure 16A:
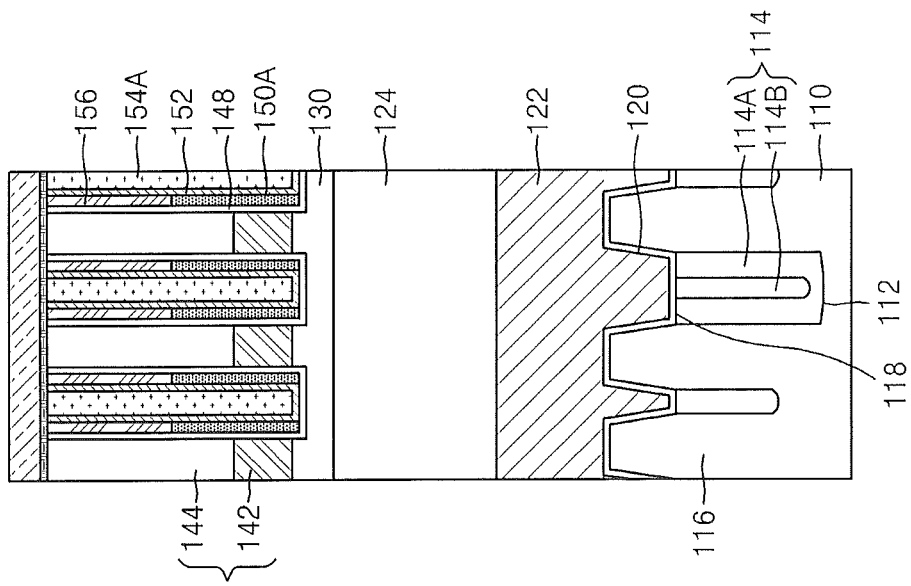
Figure 16B:
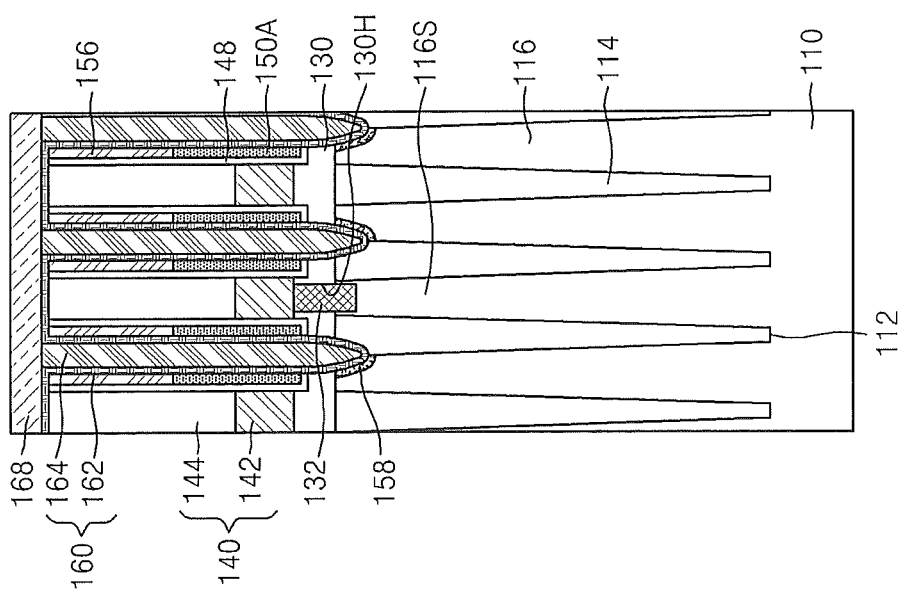

Referring to FIGS. 16A and 16B, in a similar manner to that described with reference to FIGS. 10A and 10B, the plurality of contact holes 154H may be filled with a conductive material to form a plurality of contact plugs 160, and a pad conductive layer 168 may be formed on the plurality of contact plugs 160.

Each of the plurality of contact plugs 160 may include a barrier layer 162 covering an inner wall of each of the plurality of contact holes 154H and a conductive plug 164 formed on the barrier layer 162 to fill the corresponding contact hole 154H. The barrier layer 162 may be in contact with the sacrificial spacer pattern 150A and the support layer 156 exposed on sidewalls of the plurality of contact holes 154H.

Referring to FIGS. 17A and 17B, in a similar manner to that described with reference to FIGS. 11A and 11B, a mask pattern 170 may be formed on the pad conductive layer 168, and a plurality of upper spaces 172 exposing the plurality of sacrificial spacer patterns 150A may be formed using the mask pattern 170 as an etch mask.

Referring to FIGS. 18A and 18B, in a similar manner to that described with reference to FIGS. 12A and 12B, the plurality of sacrificial spacer patterns 150A exposed through the plurality of upper spaces 172 may be removed, thereby forming a plurality of air spaces AS21 between a plurality of bit line stack structures 140 and the plurality of contact plugs 160.

Figure 18C:
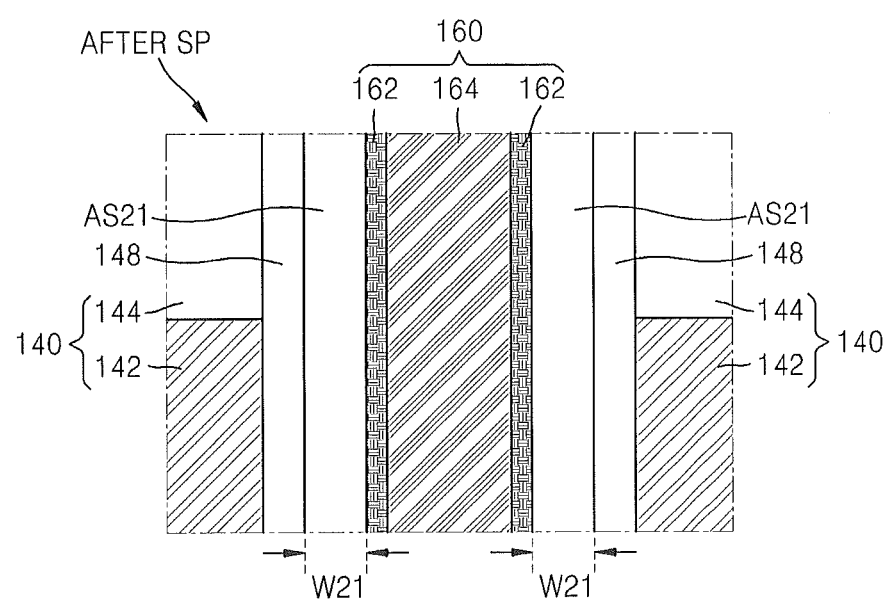
Figure 18D:
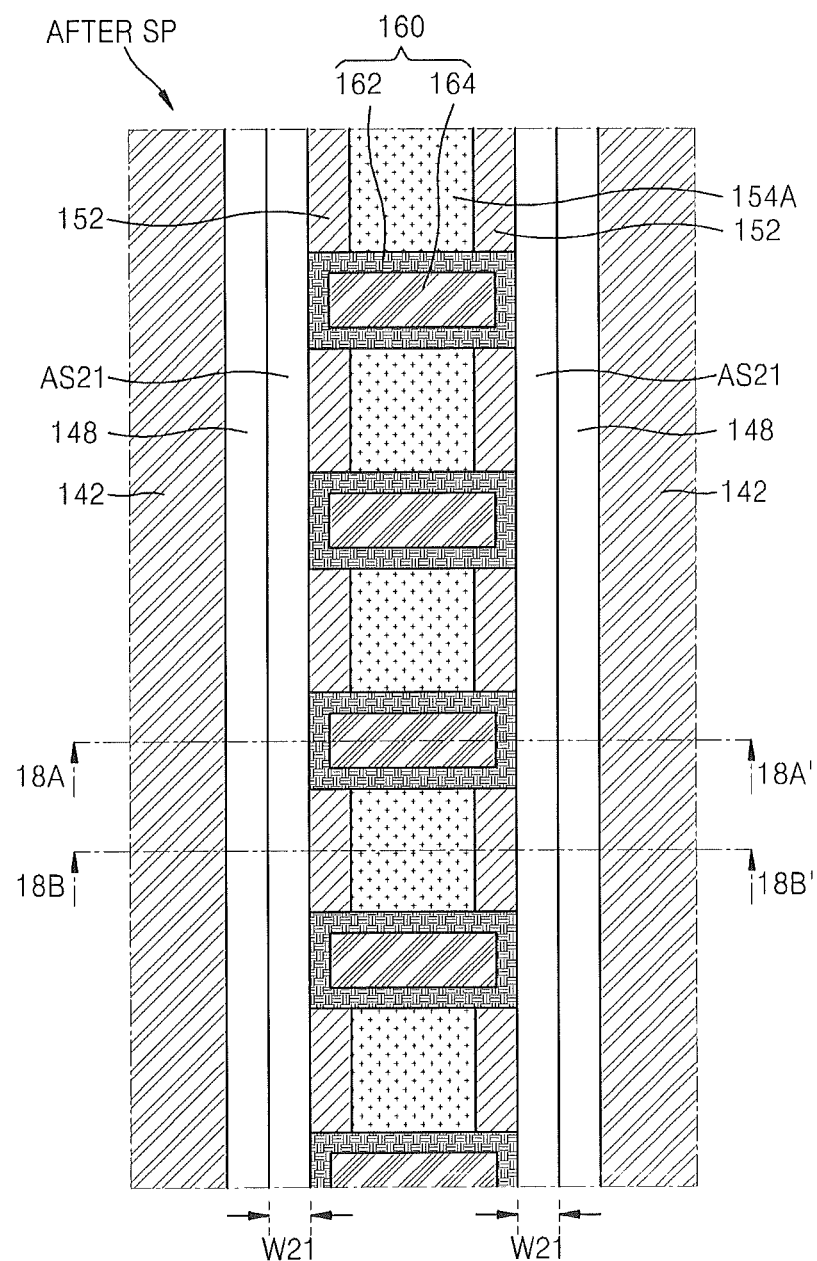

FIG. 18C is an enlarged cross-sectional view of a portion illustrated with a square AFTER SP of FIG. 18A. FIG. 18D is an enlarged plan view of the portion illustrated with the square AFTER SP of FIG. 18A.

Referring to FIGS. 18A through 18D, the insulating liner 148 and the barrier layer 162 of the contact plug 160 may be exposed on the plurality of air spaces AS21. The plurality of air spaces AS21 may have a first width W21 in the direction in which the word lines 122 extend.

Figure 19B:
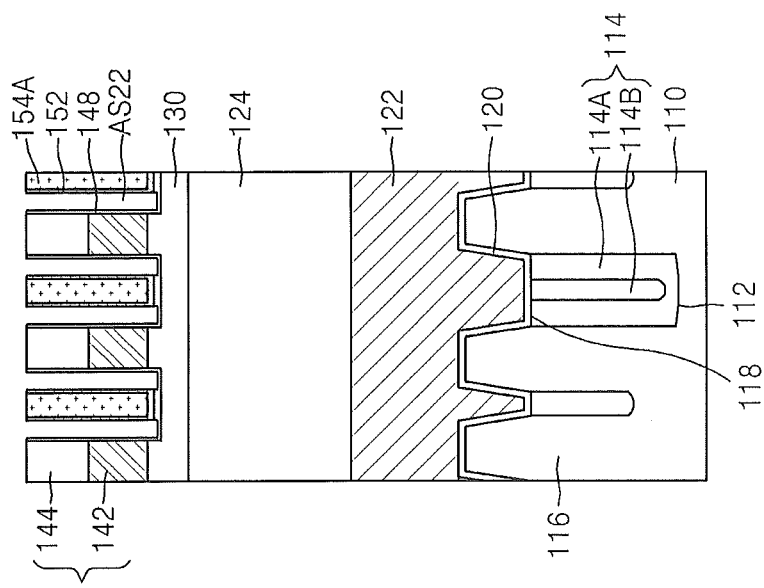
Figure 19A:
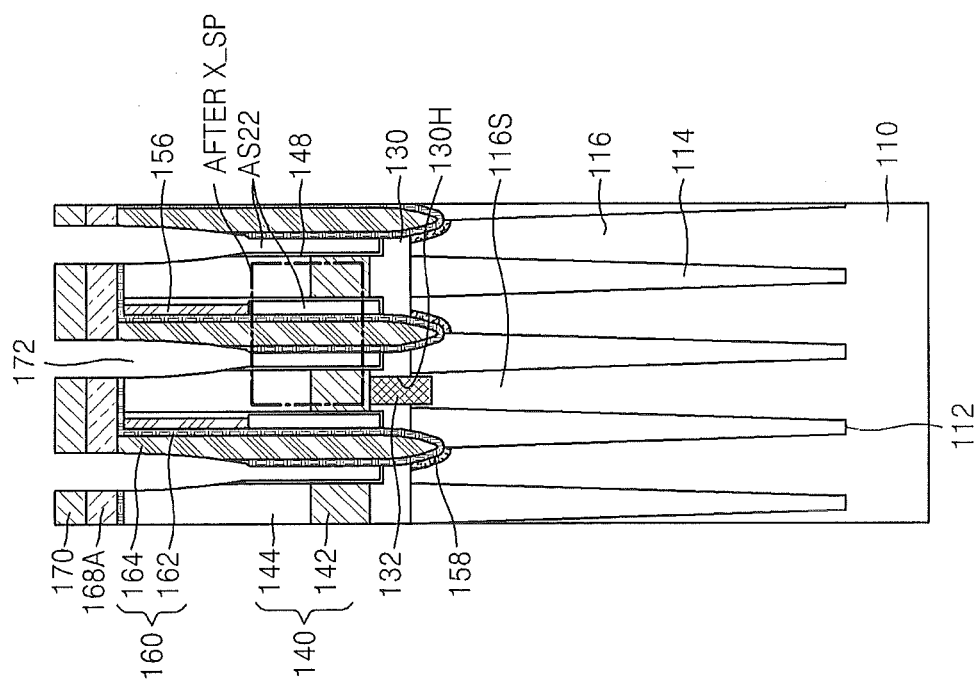

Referring to FIGS. 19A and 19B, in a similar manner to that described with reference to FIGS. 13A and 13B, a portion of each of the insulating liner 148 and the second sacrificial layer 152 exposed on the plurality of air spaces AS21 may be removed by the upper space 172 to expand the width of the plurality of air spaces AS21, thereby forming a plurality of expanded air spaces AS22.

Figure 19C:
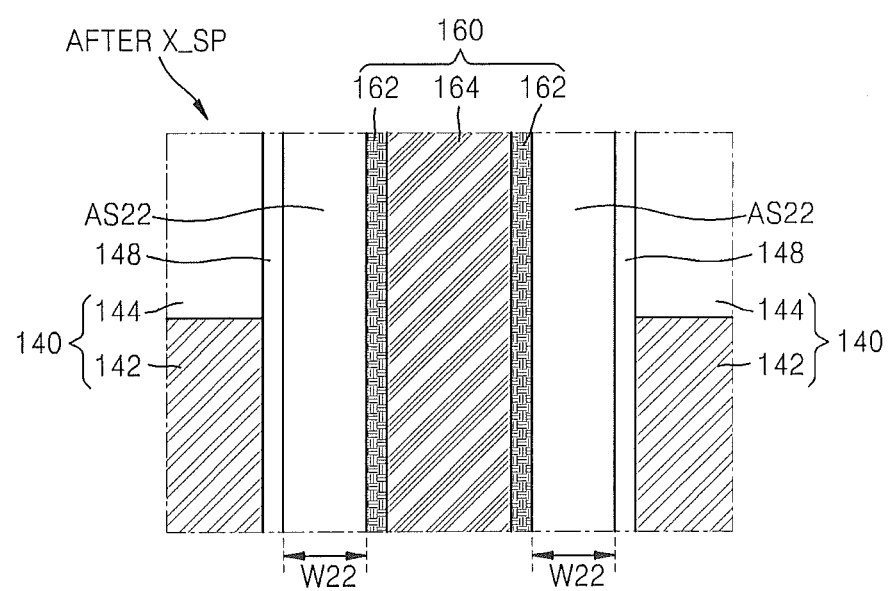
Figure 19D:
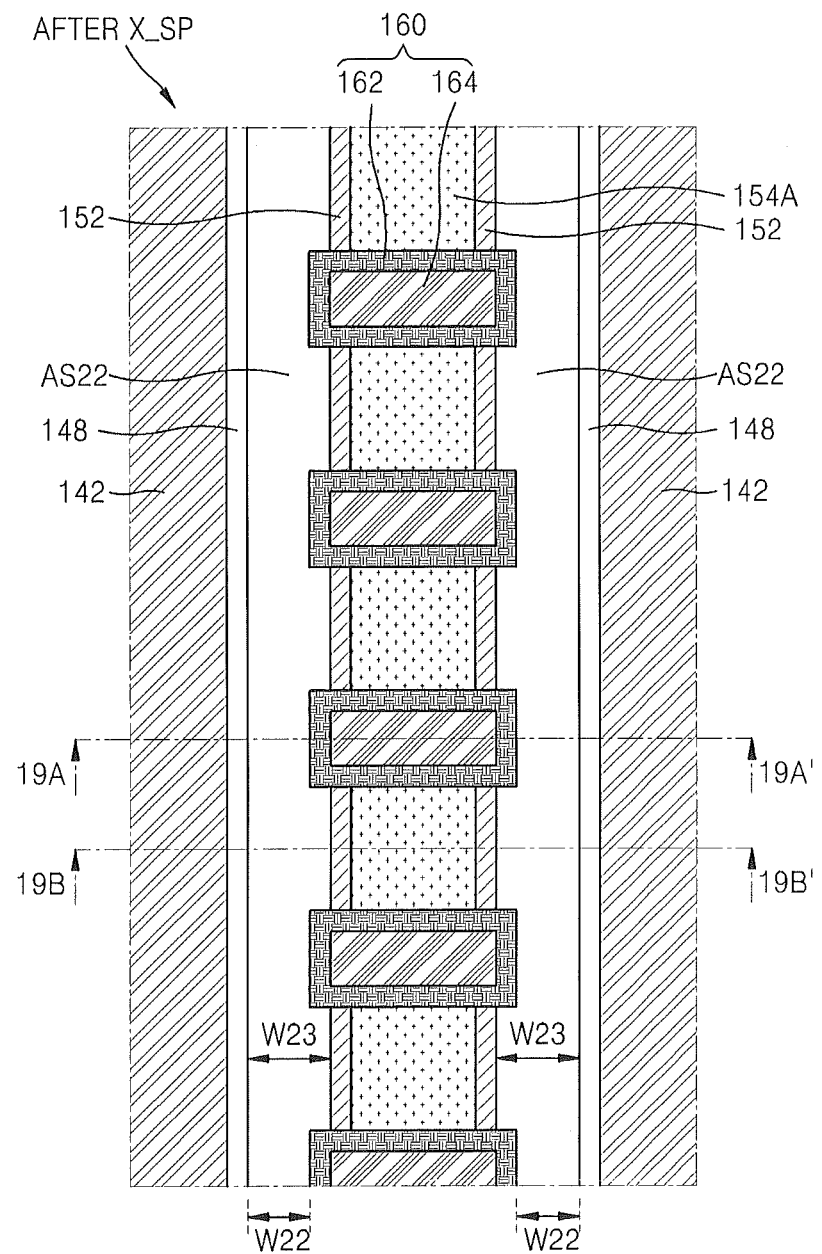

FIG. 19C is an enlarged cross-sectional view of a portion illustrated with a square AFTER X_SP of FIG. 19A. FIG. 19D is an enlarged plan view of the portion illustrated with the square AFTER X_SP of FIG. 19A.

Referring to FIGS. 19A through 19D, an insulating liner 148 having a reduced width, a second sacrificial layer 152 having a reduced width, and the barrier layer 162 of the plurality of contact plugs 160 may be exposed on the plurality of expanded air spaces AS22.

In the present embodiments, the plurality of expanded air spaces AS22 may extend parallel to the direction in which the bit lines 142 extend, and have a non-uniform width in the lengthwise direction thereof. More specifically, the plurality of expanded air spaces AS22 may have a second width W22, which is greater than the first width W21 (refer to FIG. 18D), on both sides of the plurality of contact plugs 160 between the contact plugs 160 and the bit lines 142 in the direction in which the word lines 122 extend. Also, the plurality of expanded air spaces AS22 may have a third width W23, which is greater than the second width W22, on both sides of insulating patterns 154A between the insulating patterns 154A and the bit lines 142 in the direction in which the word lines 122 extend.

To form the plurality of expanded air spaces AS22, a portion of each of the insulating liner 148 and the second sacrificial layer 152 may be removed through the upper space 172 using a wet etching process or dry etching process.

Referring to FIGS. 20A and 20B, after removing the mask pattern 170, in a similar manner to that described with reference to FIGS. 14A and 14B, an insulating material may be deposited on a substrate 110 to form a capping layer 190 filling the upper spaces 172.

During the formation of the upper insulating layer 190, an insulating material may be deposited within the expanded air spaces AS22 from the upper spaces 172. As a result, a capping liner 190L may be formed of the same material as the capping layer 190 on inner walls of the expanded air spaces AS22 in regions except portions of the expanded air spaces AS22, which are covered with the plurality of landing pads 168A. In the present embodiment, the capping liner 190L may be formed on the surface of the insulating liner 148, the surface of the second sacrificial layer 152, and the surface of the barrier layer 162 of the plurality of contact plugs 160, which are exposed within the expanded air spaces AS22. However, the inventive concept is not limited thereto, and the capping liner 190L may not be necessarily formed. For example, portions of the inner walls of the expanded air spaces AS22 may not be covered with the capping liner 190L. Alternatively, the capping liner 190L may not be formed within the expanded air spaces AS22.

Figure 20C:
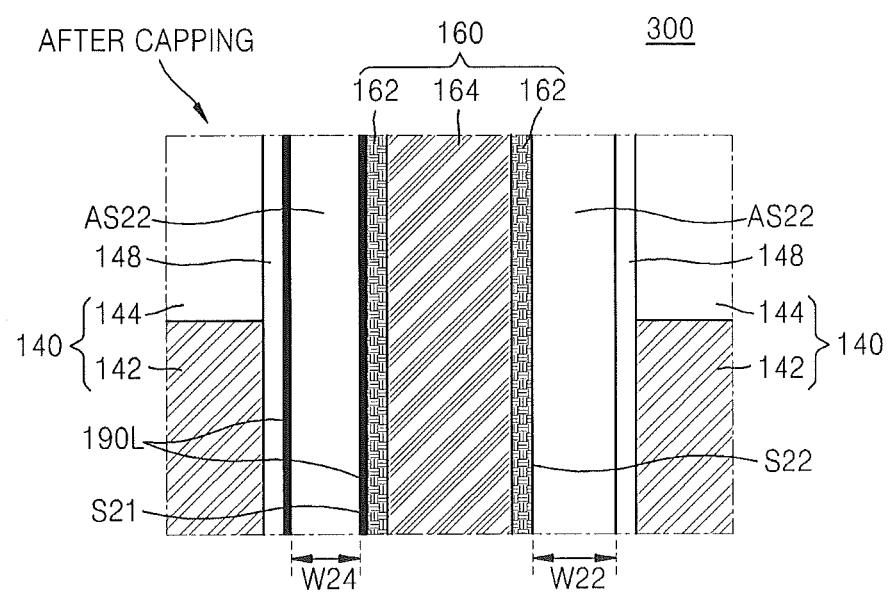
Figure 20D:
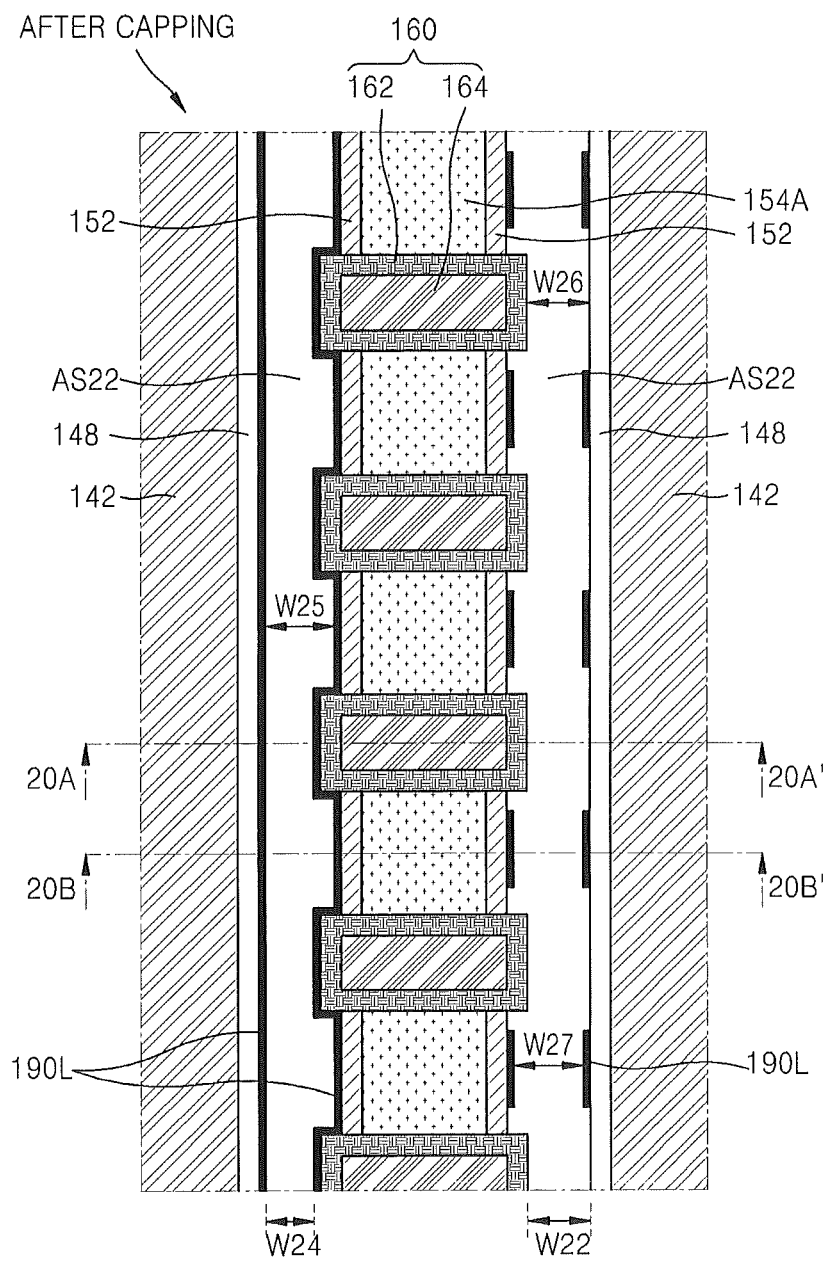

FIG. 20C is an enlarged cross-sectional view of a portion illustrated with a square AFTER CAPPING of FIG. 20A. FIG. 20D is an enlarged plan view of the portion illustrated with the square AFTER CAPPING of FIG. 20A.

Referring to FIGS. 20A through 20D, asymmetric air spaces may be formed on both sides of one contact plug 160. That is, a capping liner 190L may be formed on an inner wall of the expanded air space AS22 between a first sidewall S21 (refer to FIGS. 20C and 20D) of the contact plug 160 and the bit line 142 facing the first sidewall S21, so that the expanded air space AS22 can have a fourth width W24 that is smaller than the second width W22. Since the expanded air space AS22 is covered with the landing pad 168A between a second sidewall S22 (refer to FIGS. 14C and 14D), which is the opposite side of the first sidewall S21 of the contact plug 160, and the bit line 142 facing the second sidewall S22, the capping liner 190L may not be formed on the inner wall of the expanded air space AS22. Accordingly, the expanded air space AS22 may maintain the second width W22 between the second sidewall S22 of each of the plurality of contact plugs 160 and the bit line 142 facing the second sidewall S22. As described above, the semiconductor device 300 including asymmetric air spaces having different widths (i.e., the fourth width W24 and the second width W22) on both sides of one contact plug 160 may be formed.

In contrast, the expanded air space AS22 may have about the same widths or similar widths on both sides of the insulating pattern 154A due to the capping liners 190L formed on both sides of the insulating pattern 154A.

Furthermore, in the present embodiments, the plurality of expanded air spaces AS22 may have a non-uniform width in the lengthwise direction thereof, which is parallel to the bit lines 142. More specifically, as shown in FIG. 20D, based on the contact plugs 160 arranged in a row in the direction in which the bit lines 142 extend, the expanded air space AS22 facing the first sidewall S21 may have the fourth width W24 between the contact plug 160 and the bit line 142 in the direction in which the word lines 122 extend, and have a fifth width W25, which is greater than the fourth width W22, between the insulating pattern 154A and the bit line 142 in the direction in which the word lines 122 extend. As shown in FIG. 20D, based on the contact plugs 160 arranged in a row in the direction in which the bit lines 142 extend, the expanded air space AS22 facing the second sidewall S22 may have the sixth width W26 between the contact plug 160 and the bit line 142 in the direction in which the word lines 122 extend. Due to the capping liner 190L intermittently formed on the second sacrificial layer 152 covering the insulating line 142, the expanded air space AS22 facing the second sidewall S22 may have a seventh width W27, which is different from the sixth width W26, between the insulating pattern 154A and the bit line 142 in the direction in which the word lines 122 extend. The seventh width W27 may be greater than the sixth width W26 and smaller than the third width W23 (refer to FIG. 19D).

Thereafter, a plurality of capacitors (not shown) may be formed through the capping layer 190 and electrically connected to the plurality of contact plugs 160.

FIGS. 21A through 21K are cross-sectional views illustrating operations for manufacturing a semiconductor device according to still further exemplary embodiments of the inventive concept. FIGS. 21A through 21K illustrate operations for manufacturing the semiconductor device 300 shown in FIGS. 20A through 20D.

FIGS. 21A through 21K are cross-sectional views of the portion taken along line A-A' of FIG. 1. In FIGS. 21A through 21K, the same reference numerals are used to denote the same items as in FIGS. 1 through 20D, and a detailed description of the same items will be omitted.

Figure 21A:
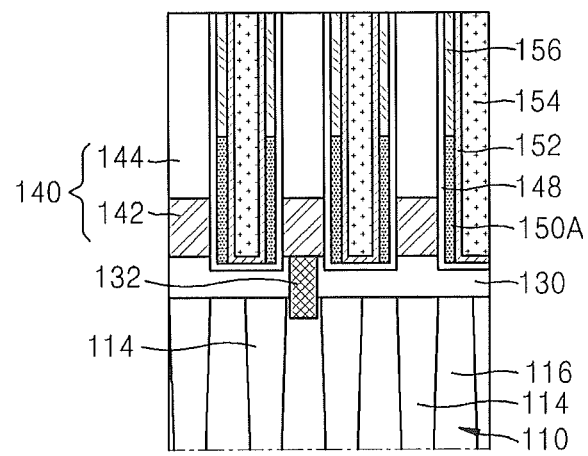
FIGS. 21A, 21B, 21C, 21D, 21E, 21F, 21G, 21H, 21i, 21j, and 21k are cross-sectional views illustrating operations for manufacturing a semiconductor device according to exemplary embodiments of the inventive concept.

Referring to FIG. 21A, in the same manner as described with reference to FIGS. 3A through 8B, a plurality of insulating lines 154 and a plurality of sacrificial spacer patterns 150A may be formed on a substrate 110, and a plurality of support layers 156 may be formed on the plurality of sacrificial spacer patterns 150A.

Figure 21B:
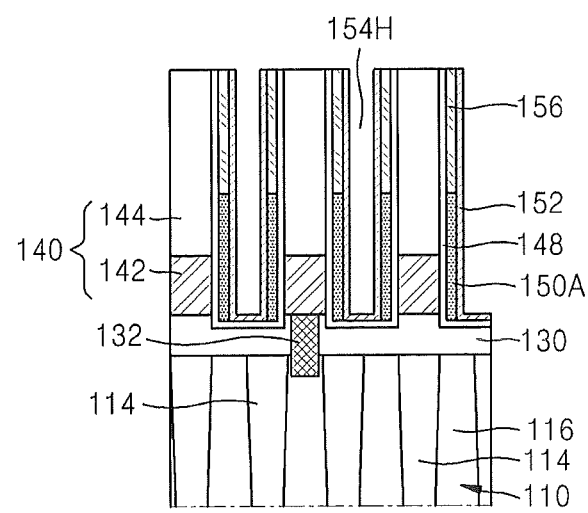

Referring to FIG. 21B, in a similar manner to that described with reference to FIGS. 9A and 9B, portions of the plurality of insulating lines 154 may be removed, thereby forming a plurality of contact holes 154H exposing a second sacrificial layer 152.

Figure 21C:
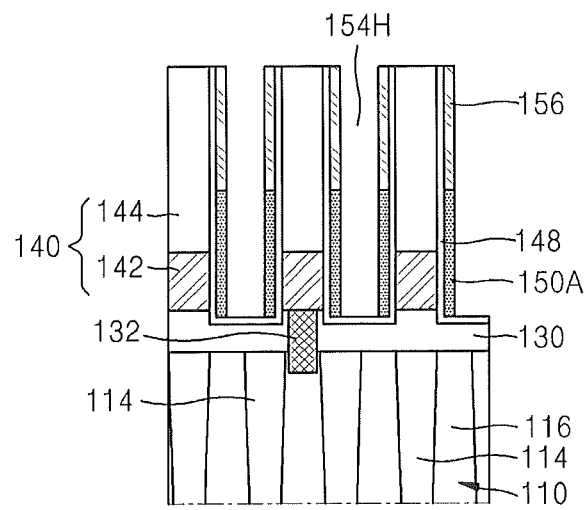

Referring to FIG. 21C, the second sacrificial layer 152 may be removed from the insides of the contact holes 154H, so that sacrificial spacer patterns 150A and a plurality of support layers 156 may be exposed on sidewalls of the contact holes 154H and an insulating liner 148 may be exposed on bottom surfaces of the contact holes 154H.

Figure 21D:
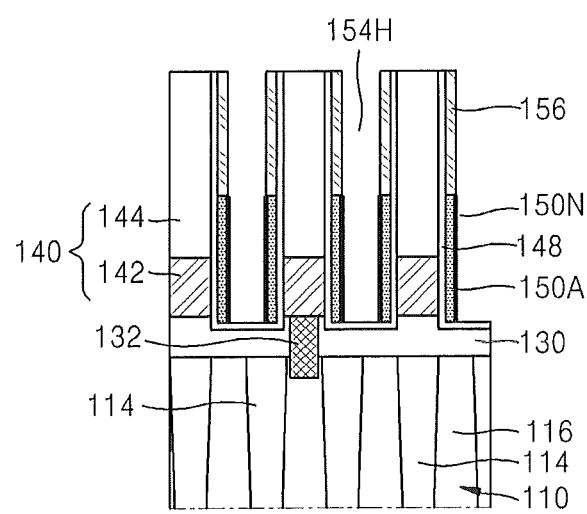

Referring to FIG. 21D, the surfaces of the sacrificial spacer patterns 150A exposed within the contact holes 154H may be nitrided, thereby forming a nitrided thin layer 150N on the surfaces of the sacrificial spacer patterns 150A.

To form the nitrided thin layer 150N, the exposed surfaces of the sacrificial spacer patterns 150A may be exposed to nitrogen plasma. For instance, when the sacrificial spacer patterns 150A are formed of poly-Si, the nitrided thin layer 150N may be a silicon nitride layer.

Figure 21E:
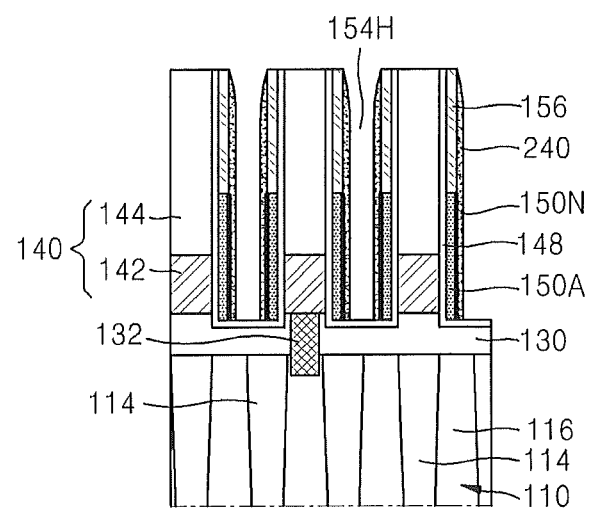

Referring to FIG. 21E, blocking spacers 240 may be formed on inner sidewalls of the contact holes 154H in which the nitride thin layer 150N is exposed.

The blocking spacers 240 may include an oxide layer, a nitride layer, or a combination thereof.

Figure 21F:
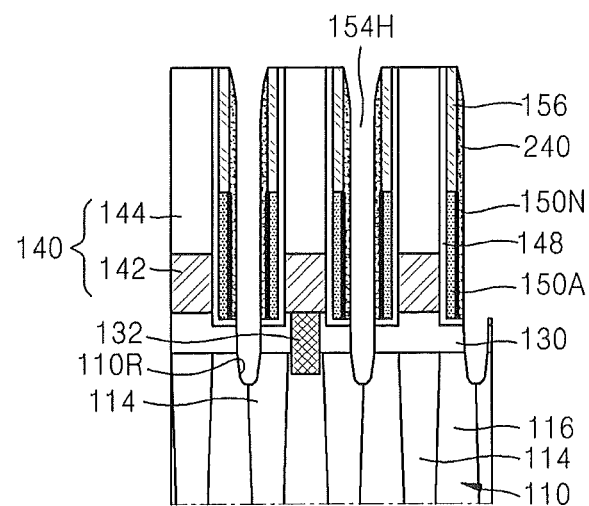

Referring to FIG. 21F, the insulating liner 148 exposed on the bottom surfaces of the contact holes 154H may be etched using the blocking spacers 240 as an etch mask. As a result, an exposed interlayer insulating pattern 130 may be etched to expose the substrate 110. As shown in FIG. 21F, the substrate 110 exposed on the contact holes 154H may be partially etched, thereby exposing recessed surfaces 110R of the substrates 110 on the bottom surfaces of the contact holes 154H.

Figure 21G:
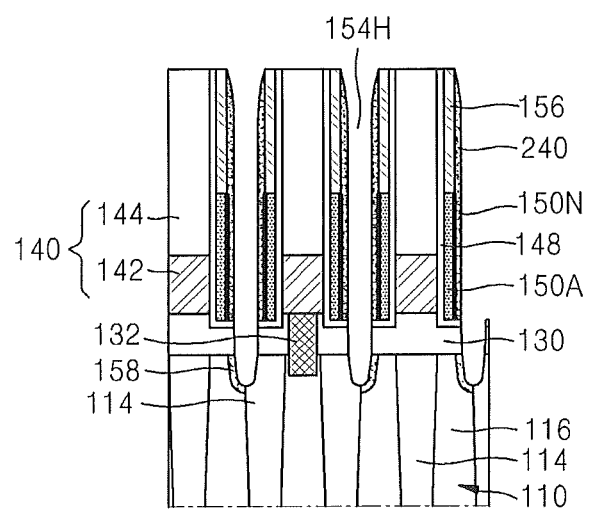

Referring to FIG. 21G, a metal silicide layer 158 may be formed on the recessed surfaces 110R of the substrate 110 exposed within the contact holes 154H. For example, the metal silicide layer 158 may include cobalt silicide. However, the inventive concept is not limited thereto, and the metal silicide layer 158 may be formed of a material selected from various kinds of metal silicides.

Figure 21H:
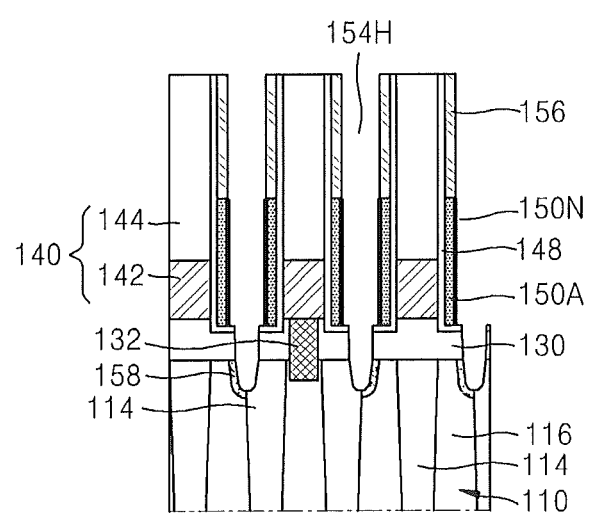

Referring to FIG. 21H, the blocking spacers 240 (refer to FIG. 21G) may be removed from the resultant structure having the metal silicide layer 158, thereby exposing the nitrided thin layer 150N and the support layers 156 within the contact holes 154H.

Figure 21I:
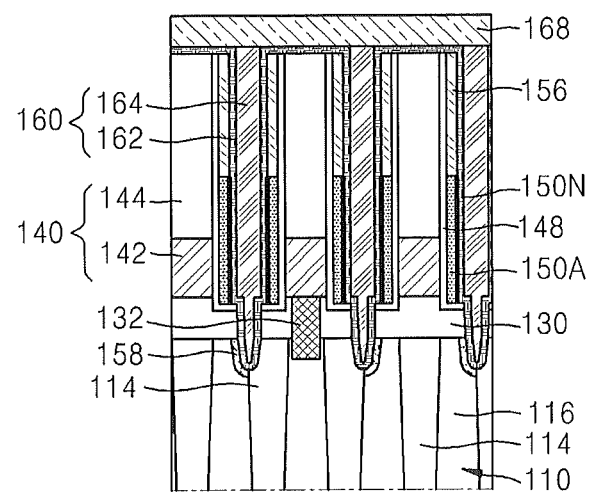

Referring to FIG. 21I, in a similar manner to that described with reference to FIGS. 16A and 16B, the contact holes 154H may be filled with a conductive material to form a plurality of contact plugs 160, and a pad conductive layer 168 may be formed on the plurality of contact plugs 160.

Each of the plurality of contact plugs 160 may include a barrier layer 162 covering an inner wall of each of the contact holes 154H and a conductive plug 164 formed on the barrier layer 162 to fill the corresponding contact hole 154H.

Since the nitrided thin layer 150N is formed on the exposed surfaces of the plurality of sacrificial spacer patterns 150A, when the barrier layer 162 is formed within the contact hole 154H, deformation due to agglomeration of the plurality of sacrificial spacer patterns 150A may be prevented. In particular, when the plurality of sacrificial spacer patterns 150A may be formed of poly-Si and the barrier layer 162 is formed of titanium, titanium nitride, or a combination thereof, agglomeration may occur during formation of titanium or titanium nitride on a poly-Si layer so that a shape of the poly-Si layer may be irregularly deformed. However, since the nitrided thin layer 150N is formed on the exposed surfaces of the plurality of sacrificial spacer patterns 150A, agglomeration and deformation of the poly-Si layer may be prevented during the formation of the barrier layer 162 on the plurality of sacrificial spacer patterns 150A. As a result, when air spaces are subsequently formed by removing the plurality of sacrificial spacer patterns 150A, the plurality of sacrificial spacer patterns 150A may be easily removed, and the air spaces having a uniform contour may be formed.

Figure 21J:
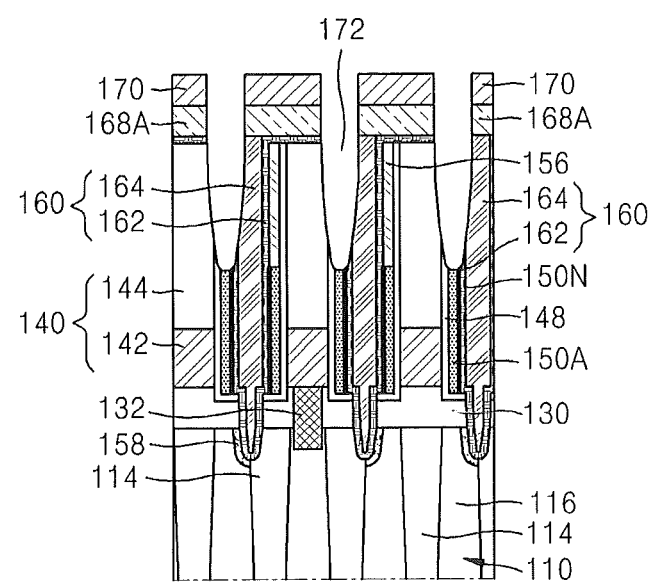

Referring to FIG. 21J, a plurality of landing pads 168A and a plurality of upper spacers 172 in a similar manner to that described with reference to FIGS. 17A and 17B.

Figure 21K:
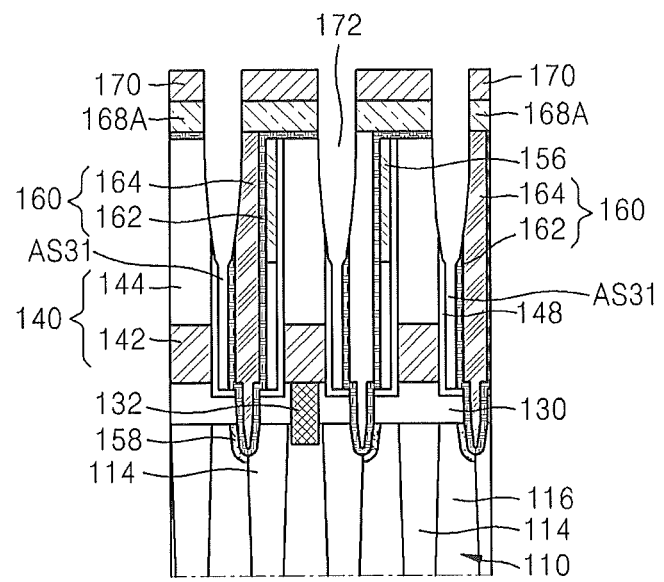

Referring to FIG. 21K, in a similar method to that described with reference to FIGS. 18A and 18B, the plurality of sacrificial spacer patterns 150A exposed through the plurality of upper spaces 172 may be removed, thereby forming a plurality of air spaces AS31 between a plurality of bit line stack structures 140 and a plurality of contact plugs 160.

During the removal of the plurality of sacrificial spacer patterns 150A, the nitrided thin layer 150N formed on the surfaces of the plurality of sacrificial spacer patterns 150A may also be removed so that the insulating liner 148 and the barrier layer 162 of the contact plug 160 may be exposed on the plurality of air spaces AS31.

Thereafter, the processes described with reference to FIGS. 19A through 20D may be performed, thereby forming the semiconductor device 300 (refer to FIGS. 20A through 20D).

FIGS. 22A through 22E are cross-sectional views illustrating process operations of a method of manufacturing a semiconductor device according to additional embodiments of the inventive concept. FIGS. 22A through 22E illustrate another method of manufacturing the semiconductor device 300 shown in FIGS. 20A through 20D.

FIGS. 22A through 22E are cross-sectional views of a portion taken along line A-A' of FIG. 1. In FIGS. 22A through 22E, the same reference numerals are used to denote the same items as in FIGS. 1 through 21K, and a detailed description of the same items will be omitted.

Figure 22A:
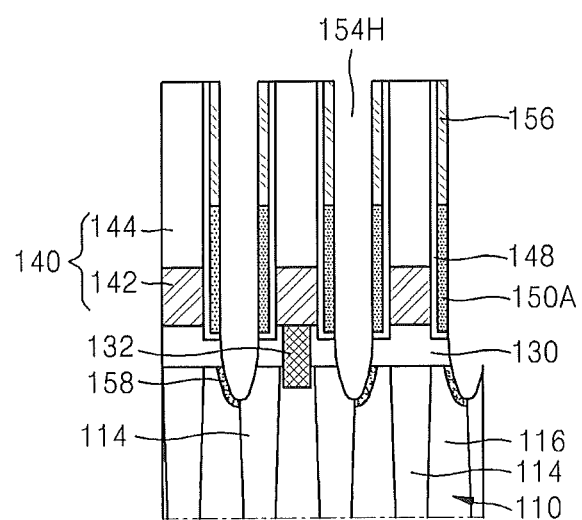
FIGS. 22A, 22B, 22C, 22D, and 22E are cross-sectional views illustrating process operations of a method of manufacturing a semiconductor device according to other embodiments of the inventive concept.

Referring to FIG. 22A, in the same manner as described with reference to FIG. 15A, a plurality of contact holes 154H may be formed in a substrate 110 to partially expose the substrate 110. A second sacrificial layer 152 exposed on sidewalls of the plurality of contact holes 154H may be removed, thereby exposing sacrificial spacer patterns 150A and a support layer 156 on the sidewalls of the plurality of contact holes 154H. Thereafter, a metal silicide layer 158 may be formed on the surface of the substrate 110 exposed on a bottom surface of each of the plurality of contact holes 154H.

Figure 22B:
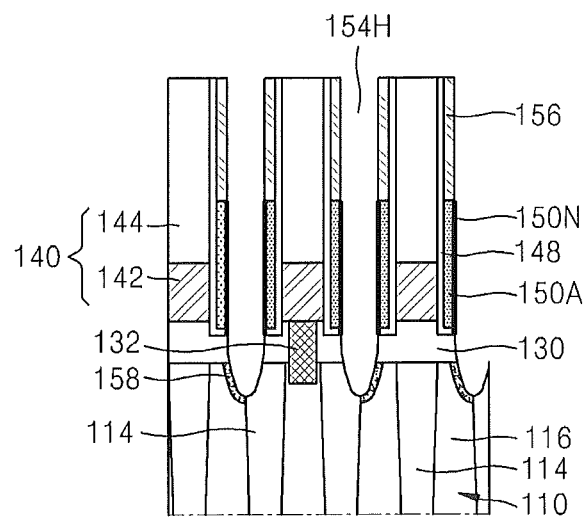

Referring to FIG. 22B, after the metal silicide layer 158 is formed on the bottom surface of each of the plurality of contact holes 154H, a nitrided thin layer 150N may be formed on the surfaces of the sacrificial spacer patterns 150A in the same manner as described with reference to FIG. 21D.

Figure 22C:
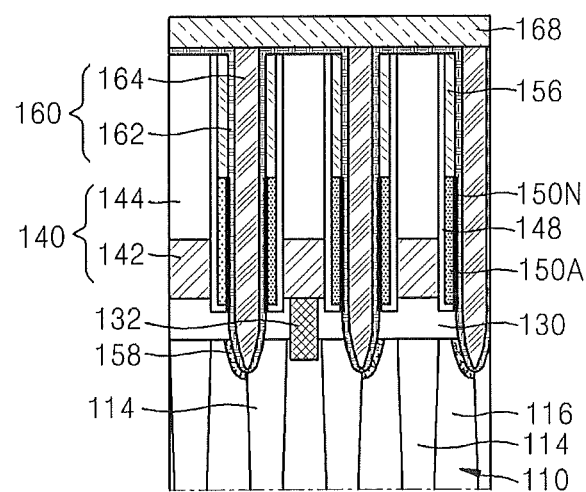

Referring to FIG. 22C, in the same manner as described with reference to FIG. 21I, the contact holes 154H may be filled with a conductive material to form a plurality of contact plugs 160. Each of the contact plugs 160 may include a barrier layer 162 and a conductive plug 164. A pad conductive layer 168 may be formed on the plurality of contact plugs 160.

Since the nitrided thin layer 150N is formed on the exposed surfaces of the plurality of sacrificial spacer patterns 150A, when the barrier layer 162 is formed within the contact holes 154H, agglomeration and deformation of the plurality of sacrificial spacer patterns 150A may be prevented. Accordingly, when air spaces are subsequently formed by removing the plurality of sacrificial spacer patterns 150A, the plurality of sacrificial spacer patterns 150A may be easily removed, and the air spaces having a uniform contour may be formed.

Figure 22D:
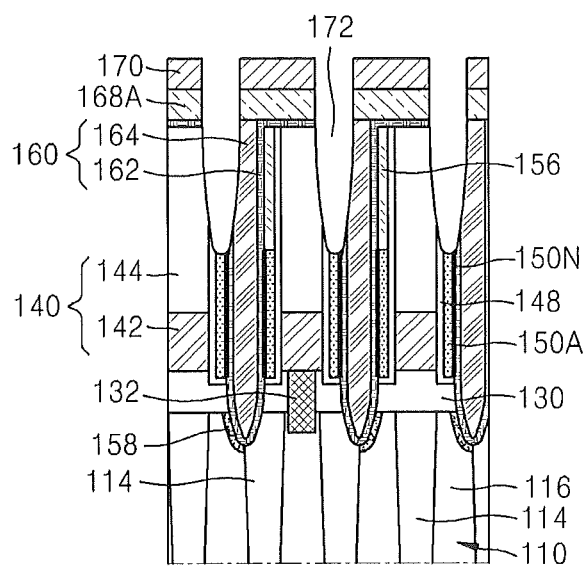

Referring to FIG. 22D, a plurality of landing pads 168A and a plurality of upper spaces 172 may be formed in a similar manner to that described with reference to FIGS. 17A and 17B.

Figure 22E:
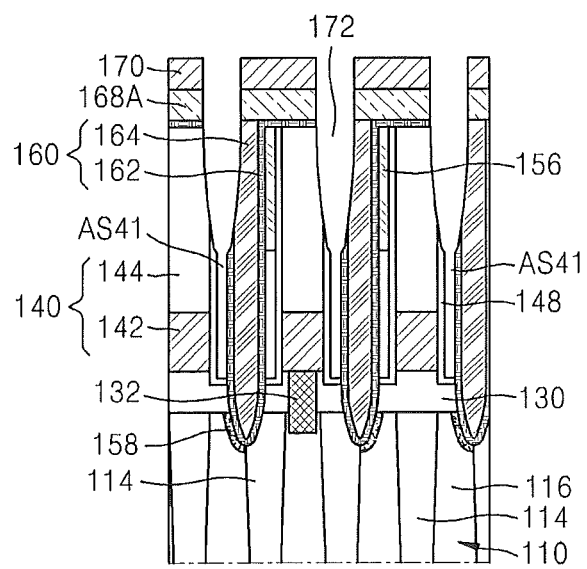

Referring to FIG. 22E, in a similar manner to that described with reference to FIGS. 18A and 18B, the plurality of sacrificial spacer patterns 150A exposed through the plurality of upper spaces 172 may be removed, thereby forming a plurality of air spaces AS41 between a plurality of bit line stack structures 140 and a plurality of contact plugs 160.

During the removal of the plurality of sacrificial spacer patterns 150A, the nitrided thin layer 150N formed on the surfaces of the plurality of sacrificial spacer patterns 150A may also be removed so that an insulating liner 148 and the barrier layer 162 of the contact plug 160 may be exposed on the plurality of air spaces AS41.

Afterwards, the processes described with reference to FIGS. 19A through 20D may be performed to form the semiconductor device 300 (refer to FIGS. 20A through 20D).

Figure 23:
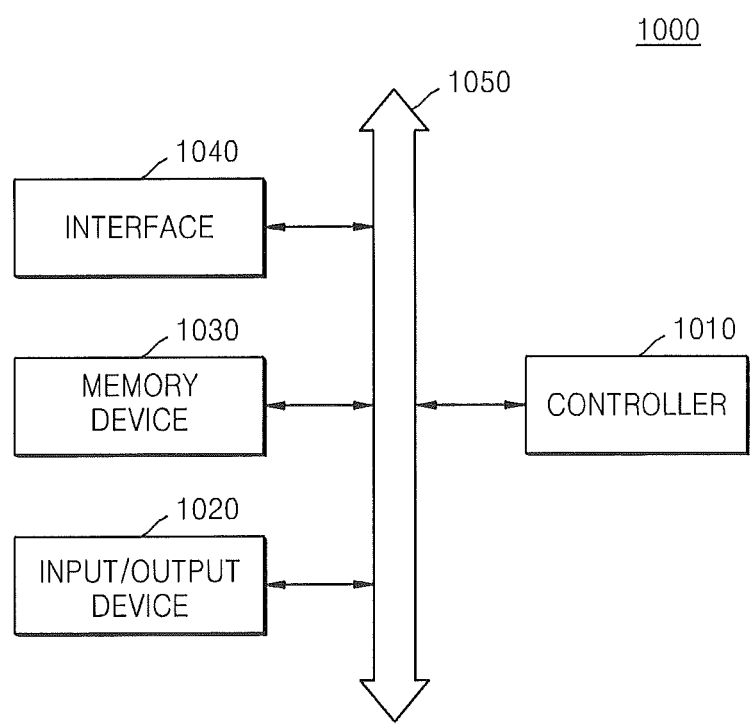
FIG. 23 is a diagram showing a system including a semiconductor device according to further exemplary embodiments of the inventive concept.

FIG. 23 is a diagram of a system including a semiconductor device 1000 according to an exemplary embodiment of the inventive concept.

The system 1000 may include a controller 1010, an input/output (I/O) device 1020, a memory device 1030, and an interface 1040. The system 1000 may be a mobile system or a system configured to transmit or receive information. In some embodiments, the mobile system may be a personal digital assistant (PDA), a portable computer, a web tablet, a wireless phone, a mobile phone, a digital music player, or a memory card. The controller 1010 may be configured to control an execution program in the system 1000. The controller 1010 may include a microprocessor (MP), a digital signal processor (DSP), a microcontroller (MC), or a similar apparatus thereto. The I/O device 1020 may be used to input or output data to or from the system 1000. The system 1000 may be connected to an external device (e.g., a personal computer (PC) or network) using the I/O device 1020 and exchange data with the external device. The I/O device 1020 may be, for example, a keypad, a keyboard, or a display device.

The memory device 1030 may store codes and/or data required for operations of the controller 1010 or store data processed by the controller 1010. The memory device 1030 may include a semiconductor device having a fin field effect transistor (FinFET) according to the inventive concept. For example, the memory device 1030 may include the semiconductor devices 100, 200, and 300 shown in FIGS. 1 through 20D.

The interface 1040 may be a data transmission path between the system 1000 and other external devices. The controller 1010, the I/O device 1020, the memory device 1030, and the interface 1040 may communicate with one another through a bus 1050. The system 1000 may be used for a mobile phone, a media player 3 (MP3) player, a navigation device, a portable multimedia player (PMP), a solid-state disk (SSD), or household appliances.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a substrate;
   a conductive plug on an active region of the substrate and configured to electrically connect the active region to a storage electrode of a capacitor, the conductive plug having respective first and second sidewalls at opposite first and second sides thereof;
   first and second conductive lines on the substrate on respective ones of the first and second sides of conductive plug and separated from the respective first and second sidewalls by asymmetric first and second air spaces;
   a first insulating layer covering a sidewall of the first conductive line between the first air space and the first conductive line;
   a second insulating layer covering the first sidewall of the conductive plug; and
   a third insulating layer covering a sidewall of the second conductive line between the second air space and the second conductive line.

2. The device of claim 1, wherein the first and second air spaces have different widths.

3. The device of claim 2, wherein at least one of the first and second air spaces has a non-uniform width.

4. The device of claim 3, wherein the first air space has a uniform width and wherein the second air space has a non-uniform width.

5. The device of claim 1, wherein the first and second conductive lines are bit lines.

6. The device of claim 1, wherein the second sidewall of the conductive plug and the third insulating layer are exposed in the second air space.

7. The device of claim 1, further comprising a fourth insulating layer covering the second sidewall of the conductive plug.

8. The device of claim 1, wherein the first and second insulating layers have different thicknesses.

9. The device of claim 1, wherein the thickness of the first insulating layer is greater than the thickness of the second insulating layer.

10. The device of claim 1, wherein the conductive plug is one of a plurality of contact plugs arranged in a row along a first direction between the first and second conductive lines and wherein the device further comprises a plurality of insulating patterns, respective ones of which filling spaces between adjacent ones of the contact plugs.

11. A semiconductor device comprising:
   a substrate;
   first and second conductive lines on the substrate;
   a plurality of contact plugs arranged in a row along a first direction between the first and second conductive lines, wherein the first and second conductive lines are separated from respective first and second sidewalls of the contact plugs by asymmetric first and second air spaces; and
   a plurality of insulating patterns, respective ones of which fill spaces between adjacent ones of the contact plugs,
   wherein the plurality of contact plugs and the plurality of insulating patterns have different widths in a second direction perpendicular to the first direction.

12. The device of claim 11, wherein the first and second air spaces extend along the first direction to separate the plurality of contact plugs from the first and second conductive lines.

13. The device of claim 12, wherein the first air space has a first width between the first conductive line and the plurality of contact plugs and a second width greater than the first width between the first conductive line and the plurality of insulating patterns.

14. The device of claim 12, wherein the second air space has a first width between the second conductive line and the plurality of contact plugs and a second width greater than the first width between the second conductive line and the plurality of insulating patterns.

15. The device of claim 12, wherein the plurality of contact plugs and the plurality of insulating patterns have the same width.

16. A semiconductor device comprising:
   a substrate;
   first and second conductive bit lines disposed on the substrate and extending along a first direction; and
   a plurality of contact plugs disposed between the first and second conductive bit lines and separated therefrom by asymmetrical first and second air spaces, the conductive plugs configured to electrically connect active regions of the substrate to storage electrodes of capacitors.

17. The device of claim 16, wherein at least one of the first and second air spaces has an irregular width along a lengthwise direction thereof.

18. The device of claim 16, further comprising a first insulating layer covering sidewalls of the plurality of contact plugs facing the first air space.

19. The device of claim 16, further comprising a second insulating layer covering sidewalls of the plurality of contact plugs facing the second air space.

* * * * *